(12) United States Patent
Ryu et al.

(10) Patent No.: US 11,088,219 B2
(45) Date of Patent: Aug. 10, 2021

(54) DISPLAY DEVICE

(71) Applicant: Samsung Display Co., Ltd., Yongin-si (KR)

(72) Inventors: Ji Hun Ryu, Hwaseong-si (KR); Yun Ho Kim, Hwaseong-si (KR); Il Nam Kim, Hwaseong-si (KR); Eun Jin Sung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 92 days.

(21) Appl. No.: 16/681,743

(22) Filed: Nov. 12, 2019

(65) Prior Publication Data

US 2020/0219946 A1 Jul. 9, 2020

(30) Foreign Application Priority Data

Jan. 4, 2019 (KR) ........................ 10-2019-0001284

(51) Int. Cl.
*H01L 27/32* (2006.01)
*G06K 9/00* (2006.01)

(52) U.S. Cl.
CPC ...... *H01L 27/3227* (2013.01); *G06K 9/00013* (2013.01); *H01L 27/3272* (2013.01); *H01L 27/3276* (2013.01)

(58) Field of Classification Search
CPC .............. G06K 9/00013; G06K 9/0004; H01L 27/3276; H01L 27/3272; H01L 27/3234; H01L 27/3227; H01L 27/326; H01L 51/5209
See application file for complete search history.

(56) References Cited

U.S. PATENT DOCUMENTS

| 10,199,449 | B2* | 2/2019 | Kim | H01L 27/3279 |
| 10,817,696 | B2* | 10/2020 | Yoshii | G06F 3/0421 |
| 2010/0007632 | A1* | 1/2010 | Yamazaki | G06F 3/0421 345/175 |
| 2017/0185180 | A1* | 6/2017 | Chae | G06F 3/0448 |
| 2017/0351898 | A1 | 12/2017 | Zhang | |
| 2018/0130857 | A1* | 5/2018 | Lee | H01L 27/323 |

FOREIGN PATENT DOCUMENTS

| KR | 10-2018-0051692 | 5/2018 |
| KR | 10-2018-0055015 | 5/2018 |

* cited by examiner

*Primary Examiner* — Kyoung Lee
*Assistant Examiner* — Christina A Sylvia
(74) *Attorney, Agent, or Firm* — H.C. Park & Associates, PLC

(57) ABSTRACT

A display device including a plurality of pixels arranged in a matrix includes a substrate, a first anode disposed on the substrate, and opaque conductive layers disposed between the substrate and the first anode, in which the plurality of pixels include an opening pixel including a first anode arrangement region, a pinhole region located around the first anode arrangement region and surrounded by the first anode, and a first anode non-arrangement region including an exposed region located outside the first anode, and the opaque conductive layers completely cover the exposed region and at least partially expose the pinhole region.

20 Claims, 17 Drawing Sheets

FIG. 5
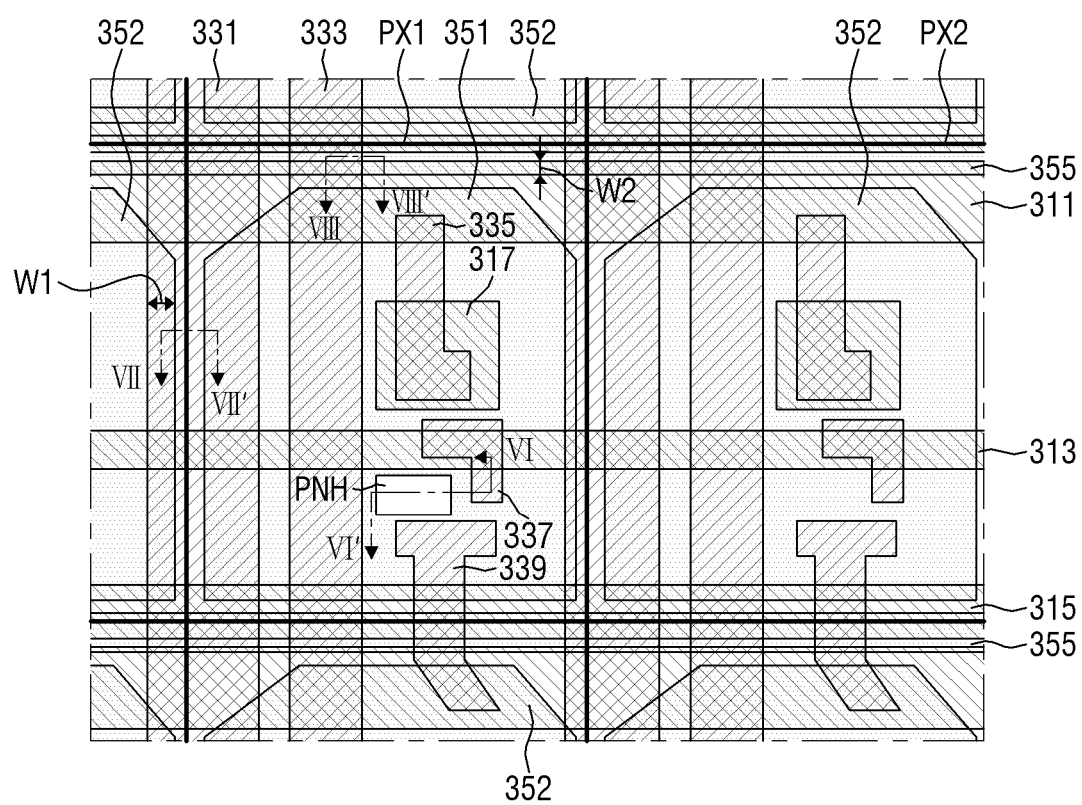
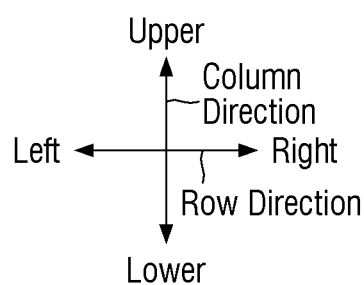

FIG. 17
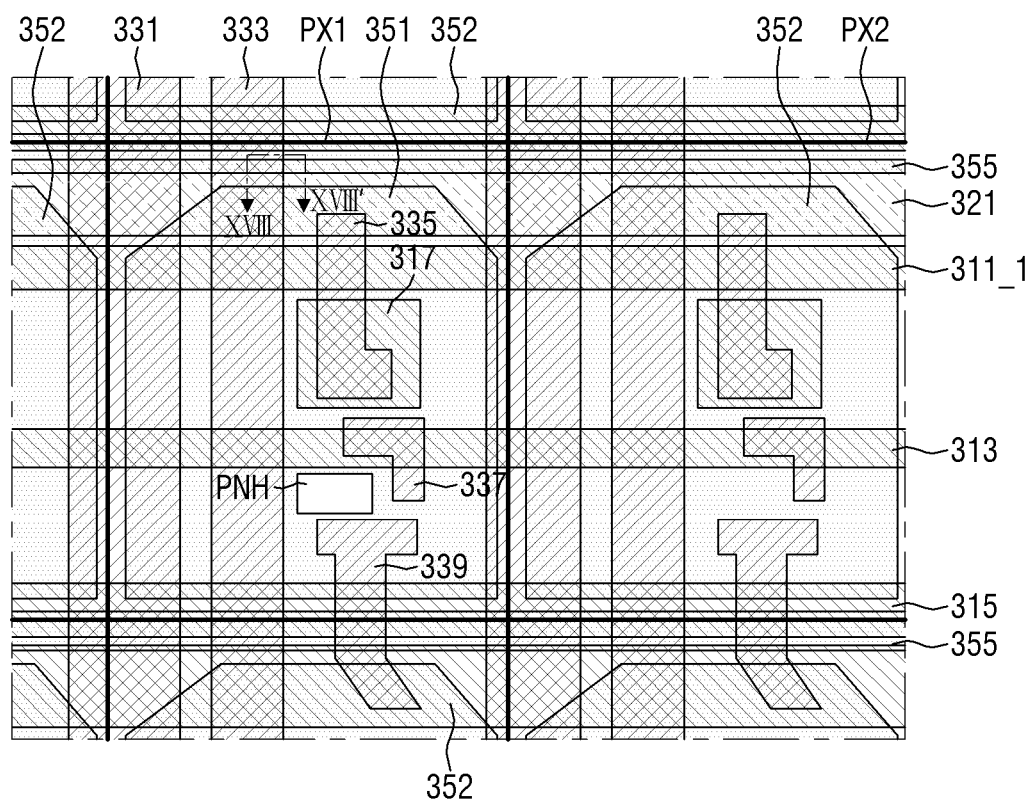
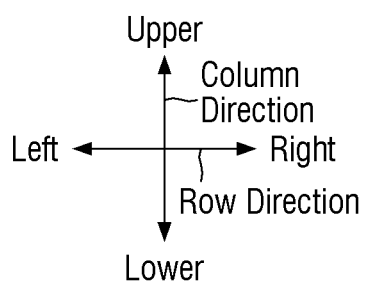

DISPLAY DEVICE

CROSS-REFERENCE TO RELATED APPLICATION

This application claims priority from and the benefit of Korean Patent Application No. 10-2019-0001284 filed on Jan. 4, 2019, which is hereby incorporated by reference for all purposes as if fully set forth herein.

BACKGROUND

Field

Exemplary embodiments of the invention relate generally to a display device.

Discussion of the Background

Display devices are becoming increasingly important with the development of multimedia. Accordingly, various types of display devices, such as a liquid crystal display (LCD), an organic light emitting display (OLED), and the like are being used. Among the display devices, the organic light emitting display device displays an image using an organic light emitting element that generates light by recombination of electrons and holes. The organic light emitting display device includes a plurality of transistors that provide a driving current to the organic light emitting element.

The above information disclosed in this Background section is only for understanding of the background of the inventive concepts, and, therefore, it may contain information that does not constitute prior art.

SUMMARY

Display devices constructed according to exemplary embodiments of the invention are capable of reducing the noise in an embedded fingerprint sensor.

Additional features of the inventive concepts will be set forth in the description which follows, and in part will be apparent from the description, or may be learned by practice of the inventive concepts.

A display device including a plurality of pixels arranged in a matrix according to an exemplary embodiment includes a substrate, a first anode disposed on the substrate, and opaque conductive layers disposed between the substrate and the first anode, in which the plurality of pixels include an opening pixel including a first anode arrangement region, a pinhole region located around the first anode arrangement region and surrounded by the first anode, and a first anode non-arrangement region including an exposed region located outside the first anode, and the opaque conductive layers completely cover the exposed region and at least partially expose the pinhole region.

The plurality of pixels may further include a light blocking pixel adjacent to the opening pixel, in which the light blocking pixel may include a second anode arrangement region and a second anode non-arrangement region located around the second anode arrangement region, and the second anode non-arrangement region may be completely covered by the opaque conductive layers.

The pinhole region may be completely surrounded by the first anode.

The display device may further include an optical sensor arrangement region which overlaps an optical sensor disposed below the substrate, and an optical sensor non-arrangement region which does not overlap the optical sensor.

The optical sensor non-arrangement region may include only the light blocking pixel.

The optical sensor may further include an optical fingerprint sensor.

The display device may further include an optical sensor arrangement region which overlaps an optical sensor disposed below the substrate, in which the optical sensor arrangement region may include at least a part of the opening pixel and the light blocking pixel.

The opaque conductive layers may include a first conductive layer disposed on the substrate, and a second conductive layer disposed between the first conductive layer and the first anode.

The second conductive layer may be disposed to overlap a first gap between the first anode arrangement region and the second anode arrangement region.

The second conductive layer may extend to the first anode arrangement region and the second anode arrangement region adjacent thereto.

The display device may further include a via layer having a first thickness and disposed between the second conductive layer and the first anode, in which the second conductive layer may extend from the first gap such that a portion of the second conductive layer overlapping the first anode in a direction from the first anode toward the second anode may have a second with equal to or greater than three times the first thickness.

The first gap may include a first region in which the first gap and the second conductive layer overlap each other, a second region in which the first gap and the first conductive layer overlap each other, and a third region in which the first gap, the first conductive layer, and the second conductive layer overlap each other.

The first conductive layer may include at least one of a scan signal line, an emission signal line, and an initialization signal line.

The second conductive layer may include at least one of a data line and a first source voltage line.

An occupation ratio of the first anode arrangement region and the second anode arrangement region in the opening pixel and the light blocking pixel may be about 80% to about 95%, respectively.

A display device including a plurality of pixels arranged in a matrix according to another exemplary embodiment includes a substrate, a first anode disposed on the substrate, and opaque conductive layers disposed between the substrate and the first anode, in which the plurality of pixels include an opening pixel including a first anode arrangement region, a pinhole region located around the first anode arrangement region and surrounded by the first anode, and a first anode non-arrangement region including an exposed region located outside the first anode, and a light blocking pixel adjacent to the opening pixel and including a second anode arrangement region and a second anode non-arrangement region located around the second anode arrangement region, and the opaque conductive layers completely cover the exposed region of the first anode non-arrangement region and the second anode non-arrangement region, and at least partially expose the pinhole region.

The pinhole region may be completely surrounded by the first anode.

The display device may further include an optical sensor arrangement region which overlaps an optical sensor disposed below the substrate, and an optical sensor non-arrangement region which does not overlap the optical sensor.

The optical sensor arrangement region may include at least a part of the opening pixel and the light blocking pixel, and the optical sensor non-arrangement region may include only the light blocking pixel.

The optical sensor may include an optical fingerprint sensor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 5 is a layout diagram of a plurality of pixels of a display device according to an exemplary embodiment.

FIG. 17 is a layout diagram of a plurality of pixels of a display device according to still another exemplary embodiment.

DETAILED DESCRIPTION

Figure 1:
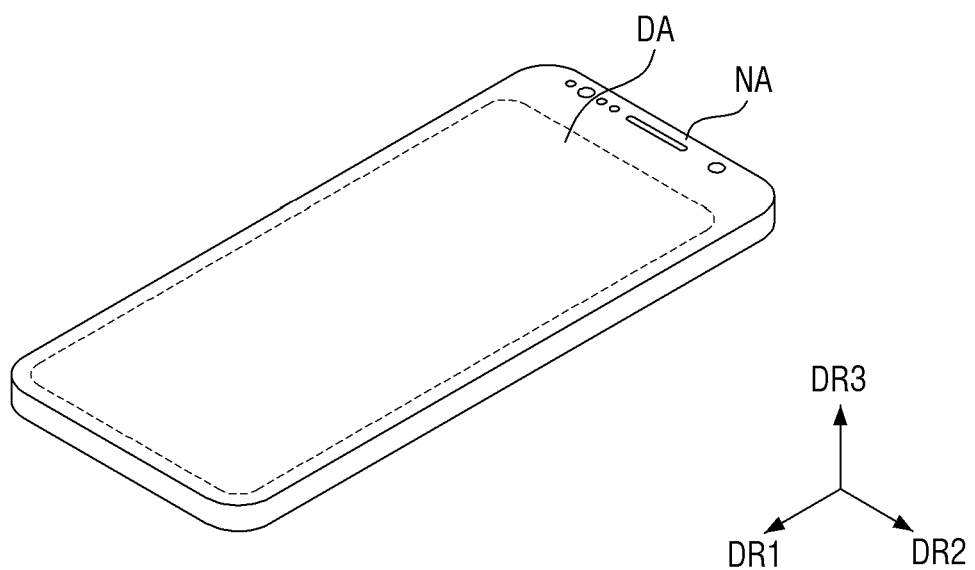
FIG. 1 is a perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to exemplary embodiments will be described with reference to an organic light emitting display device, however, the inventive concepts are not limited to one type of a display device.

Figure 2:
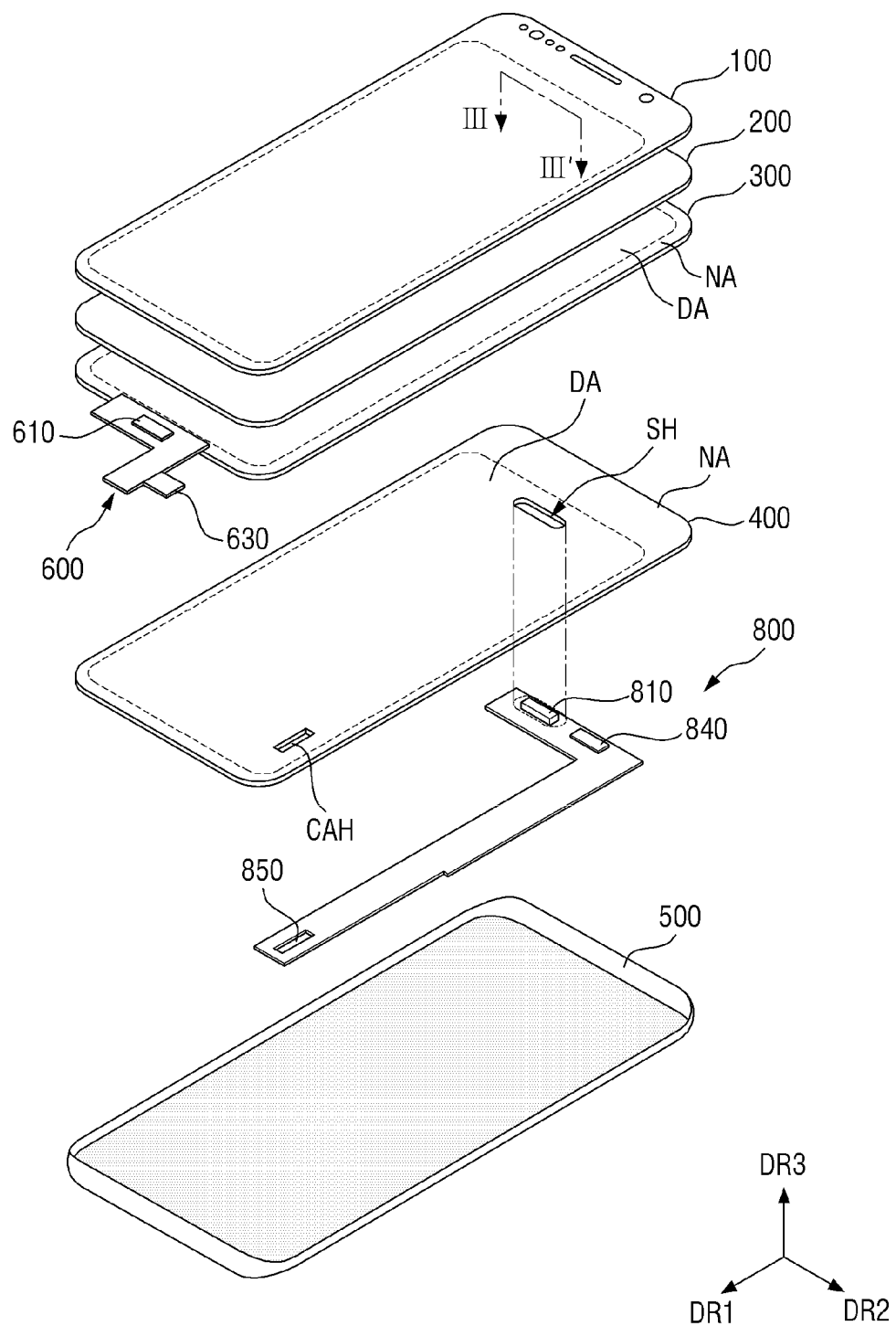
FIG. 2 is an exploded perspective view of a display device according to an exemplary embodiment.
Figure 3:
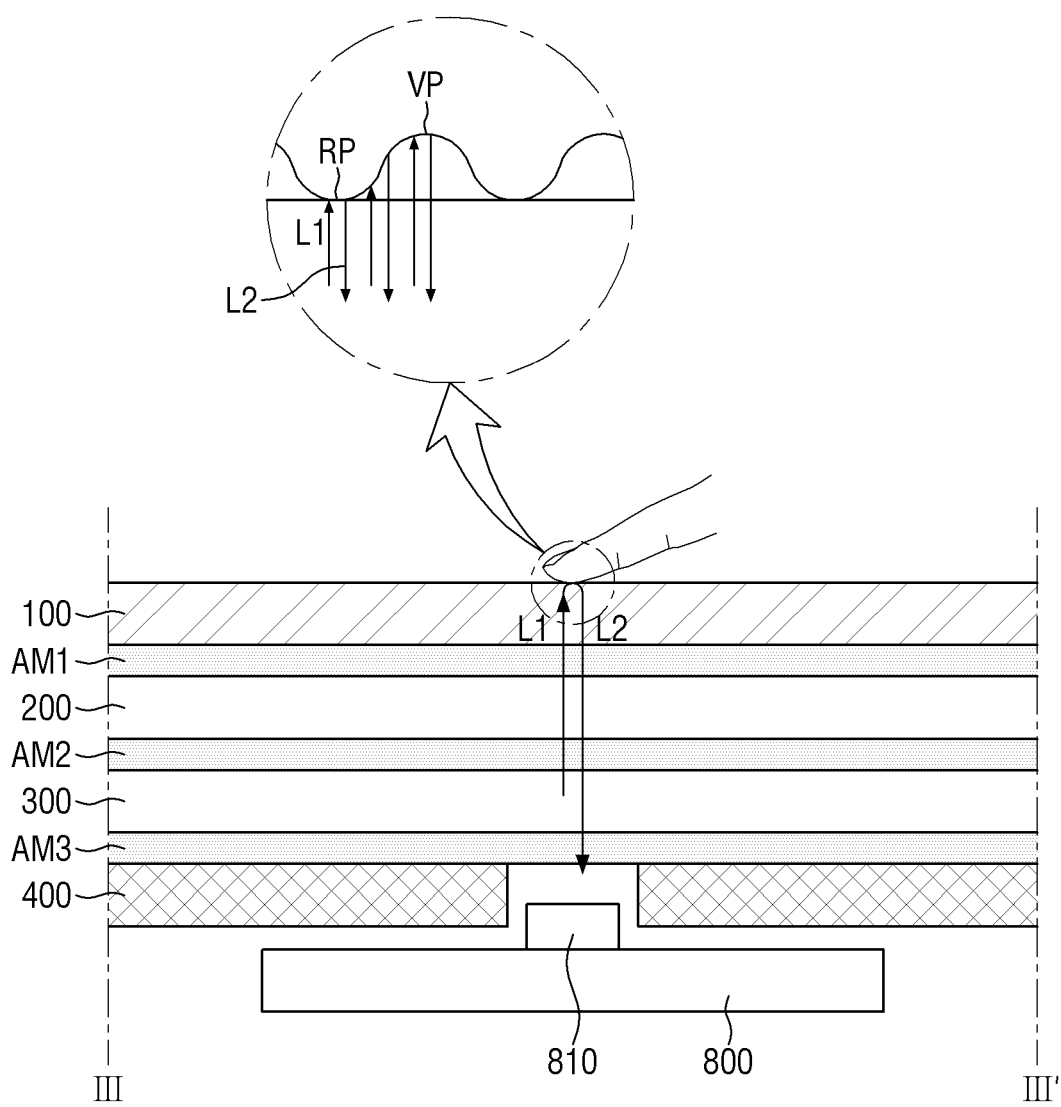
FIG. 3 is a cross-sectional view taken along line of FIG. 2.
Figure 4:
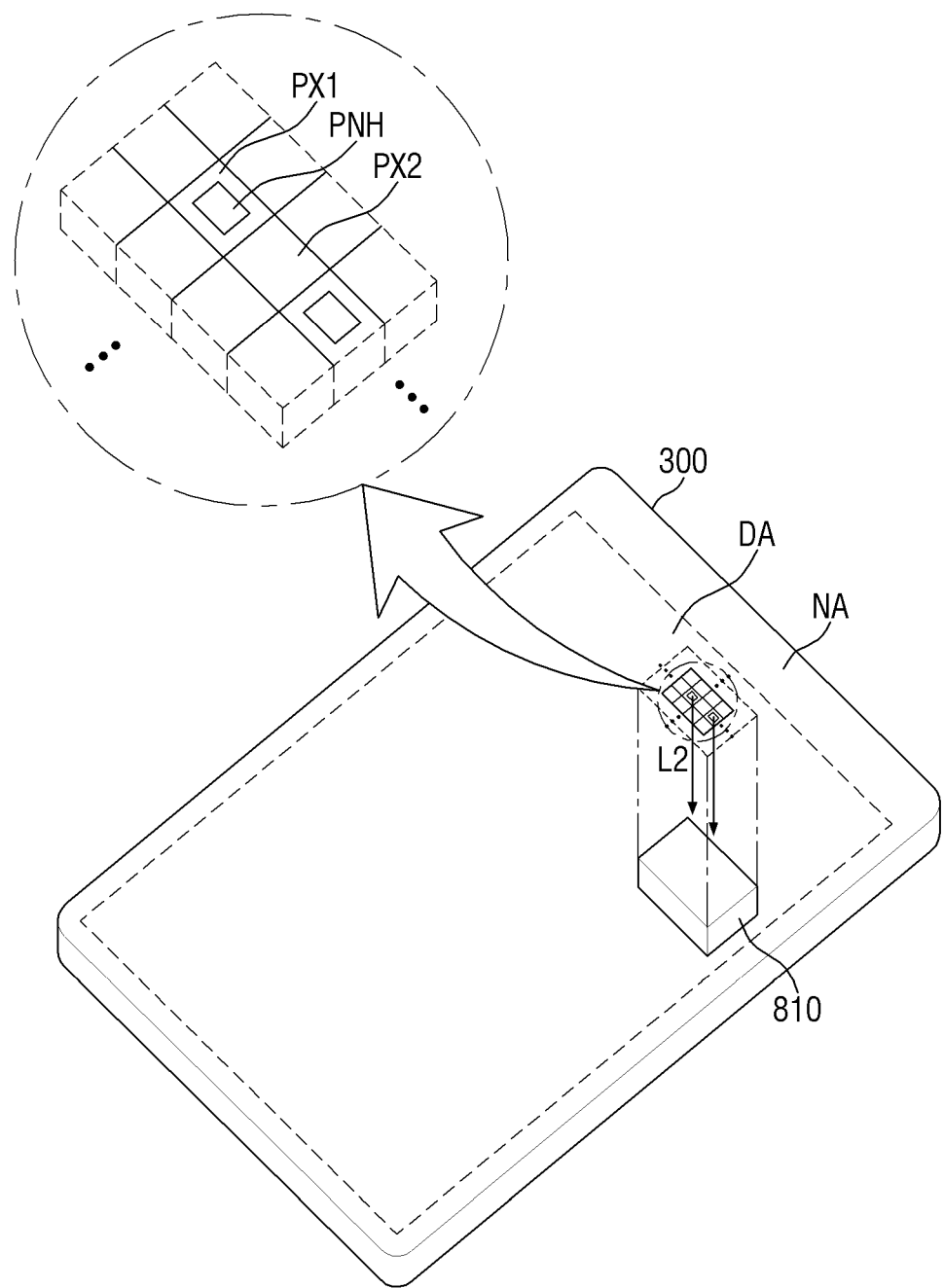
FIG. 4 is a perspective view showing a planar shape of a pixel and an optical sensor according to an exemplary embodiment.

FIG. 1 is a perspective view of a display device according to an exemplary embodiment. FIG. 2 is an exploded perspective view of a display device according to an exemplary embodiment. FIG. 3 is a cross-sectional view taken along line III-III' of FIG. 2. FIG. 4 is a perspective view showing a planar shape of a pixel and an optical sensor according to an exemplary embodiment.

As used herein, the terms "above," "top" and "upper surface" refer to a direction in which a window 100 is disposed with respect to a display panel 300 to be described later, e.g., one direction of a third direction DR3, and the terms "below," "bottom" and "lower surface" refer to a direction in which a lower frame 500 is disposed with respect to the display panel 300, e.g., the other direction of the third direction DR3.

Referring to FIGS. 1 to 4, a display device 1 according to an exemplary embodiment includes a window 100, a touch member 200 disposed below the window 100, a display panel 300 disposed below the touch member 200, a display circuit board 600 attached to the display panel 300, a display driver 610 disposed on the display circuit board 600, a cover panel 400 disposed below the display panel 300, a main circuit board 800 disposed below the cover panel 400 and including a second connector 850 physically connected to a first connector 630 of the display circuit board 600, an optical sensor 810 and a main driver 840 disposed on the main circuit board 800, and a lower frame 500.

The display device 1 may have a substantially rectangular shape in plan view. For example, the display device 1 may have long sides in a first direction DR1 and short sides in a second direction DR2, as shown in FIGS. 1 and 2. An edge where the long side in the first direction DR1 and the short side in the second direction DR2 meet may be rounded with a predetermined curvature or formed with a right angle. The planar shape of the display device 1 is not limited to a rectangular shape, but may be formed in other polygonal shapes, such as a substantially circular shape or substantially elliptical shape.

The window 100 may be disposed above the display panel 300 to cover the upper surface of the display panel 300. Accordingly, the window 100 may function to protect the upper surface of the display panel 300. The window 100 may be made of glass, sapphire, and/or plastic. The window 100 may be rigid or flexible.

The touch member 200 may be disposed between the window 100 and the display panel 300. The touch member 200 is a device for sensing a user's touch position, and may be implemented as a capacitance type, such as a self-capacitance type or a mutual capacitance type. The touch member 200 may be formed in a panel form or a film form. Alternatively, the touch member 200 may be formed integrally with the display panel 300. In this case, touch driving electrodes and touch sensing electrodes of the touch member 200 may be formed on a thin film encapsulation layer of the display panel 300. A touch circuit board including a touch driver electrically connected to the touch driving electrodes and the touch sensing electrodes of the touch member 200 may be attached to one side of the touch member 200. The touch circuit board may be a flexible printed circuit board. In some exemplary embodiments, the touch driver may be formed as an integrated circuit.

The display panel 300 may be, for example, an organic light emitting display panel. Although a display device according to the exemplary embodiments will be described with reference to an organic light emitting display panel, however, the inventive concepts are not limited thereto, and other types of display panels, such as a liquid crystal display (LCD) panel, a quantum dot organic light emitting display (QD-OLED) panel, a quantum dot liquid crystal display (QD-LCD) panel, a quantum-nano light emitting display (QNED) panel, and a micro LED panel may be applied as the display panel 300.

The display panel 300 includes a display area DA including a plurality of pixels for displaying an image and a non-display area NA located around the display area DA. The display panel 300 includes a display substrate 710 (see FIG. 8), a plurality of transistors disposed in the display area DA on the display substrate 710, and an organic light emitting element electrically connected to the plurality of transistors. The organic light emitting element may include an anode electrode, an organic light emitting layer and a cathode electrode. Each pixel may include the plurality of transistors and the organic light emitting element. When a voltage is applied to the anode electrode and the cathode electrode, holes and electrons move to the organic light emitting layer through a hole transporting layer and an electron transporting layer, respectively, and are combined with each other in the organic light emitting layer to emit light. A specific cross-sectional shape of the display panel 300 will be described later.

A thin film encapsulation layer is disposed on the organic light emitting element. The thin film encapsulation layer serves to prevent oxygen or moisture from infiltrating into the organic light emitting element. The thin film encapsulation layer may include at least one inorganic film and at least one organic film.

The display circuit board 600 may be attached to one side of the display panel 300. More specifically, the display circuit board 600 may be attached to pads provided on one side of the display panel 300 using an anisotropic conductive film. In some exemplary embodiments, the display circuit board 600 may be attached to one side of the display panel 300 via ultrasonic bonding. The display driver 610 outputs signals and voltages for driving the display panel 300 through the display circuit board 600. The display driver 610 may be formed as an integrated circuit and mounted on the display circuit board 600, but the inventive concepts are not limited thereto. For example, the display driver 610 may be attached to one side of the upper surface or the lower surface of the substrate of the display panel 300.

A lower cover panel 400 is disposed below the display panel 300. The lower cover panel 400 includes at least one functional layer. The functional layer may be a layer that performs a heat dissipation function, an electromagnetic shielding function, a grounding function, a buffering function, a rigidity enhancing function, a supporting function, and/or a digitizing function. The functional layer may be a sheet layer, a film layer, a thin layer, a coating layer, a panel, a plate, or the like. One functional layer may be formed of a single layer, but may also be formed of a plurality of laminated thin films or coating layers. The functional layer may be, for example, a supporting substrate, a heat dissipation layer, an electromagnetic shielding layer, an impact absorbing layer, a digitizer, or the like.

The lower cover panel 400 includes a cable hole CAH through which the first connector 630 of the display circuit board 600 passes in a thickness direction, and a sensor hole SH, which exposes the optical sensor 810 disposed on the main circuit board 800. Since the lower cover panel 400 has the sensor hole SH exposing the optical sensor 810, the optical sensor 810 can smoothly proceed toward the display surface.

The main circuit board 800 physically connected to the display circuit board 600 may be disposed below the lower cover panel 400. The main driver 840 disposed on the main circuit board 800 may control the display driver 610 described above.

A first optically clear adhesive member AM1 may be disposed between the window 100 and the touch member 200, a second optically clear adhesive member AM2 may be disposed between the touch member 200 and the display panel 300, and a third optically clear adhesive member AM3 may be disposed between the display panel 300 and the lower cover panel 400. The optically clear adhesive members AM1, AM2, and AM3 can couple adjacent members to each other. Each of the first and second optically clear adhesive members AM1 and AM2 may include at least one of an optically clear adhesive film, an optically clear adhesive tape, or an optically clear resin. The third optically clear adhesive member AM3 may include a general adhesive material, without being limited thereto. In some exemplary embodiments, the third optically clear adhesive member AM3 may include at least one of the above-mentioned materials of the first and second optically clear adhesive members AM1 and AM2.

The optical sensor 810 may be disposed in the sensor hole SH of the lower cover panel 400 in plan view. As shown in FIG. 3, the optical sensor 810 serves to receive reflected light L2, which may be generated after upper exit light L1 emitted in a direction toward the window 100 emitted from the display panel 300 is reflected by the user's fingerprint areas RP and VP. More particularly, the optical sensor 810 may recognize the fingerprint shape of the user by receiving information of different positions of the reflected light L2 reflected from a valley area VP, a ridge area RP, and an area between the valley area VP and the ridge area RP of the user, out of the upper exit light L1. For example, the optical sensor 810 according to an exemplary embodiment may be an optical fingerprint sensor. In addition, the optical sensor 810 may include an image capturing device to capture an image of the shape of the fingerprint of the user, thereby recognizing the shape of the fingerprint of the user.

As shown in FIG. 2, the optical sensor 810 may be disposed to overlap the display area DA. In some exemplary embodiments, the optical sensor 810 may be disposed to overlap the non-display area DA, but the inventive concepts are not limited thereto.

Referring to FIG. 4, a plurality of pixels disposed in the display area DA of the display panel 300 may be arranged in a matrix array in a row direction and a column direction. The plurality of pixels may include an opening pixel PX1 that includes a pinhole region PNH and a light blocking pixel PX2 that does not include the pinhole region PNH. Each of the opening pixel PX1 and the light blocking pixel PX2 may be provided in plural. The reflected light L2 reflected from the fingerprint of the user may proceed to the optical sensor 810 through the pinhole regions PNH of the plurality of opening pixels PX1. The light blocking pixel PX2 may be disposed adjacent to the opening pixel PX1, as shown in FIG. 4. For example, the light blocking pixel PX2 may be disposed adjacent to all of the upper, lower, left and right sides of the opening pixel PX1, without being limited thereto.

Meanwhile, over the opening pixel PX1 excluding the pinhole region PNH and the light blocking pixel PX2, when the reflected light L2 reflected from the user's fingerprint proceeds to the optical sensor 810, noise may occur when the optical sensor 810 recognizes the fingerprint shape of the user. The display device 1 according to an exemplary embodiment may cover regions except for the pinhole region PNH in plan view through conductive patterns of one or more conductive layers of the pixels PX1 and PX2 in order to prevent the reflected light L2 from leaking out of the region excluding the pinhole region PNH and proceeding to the optical sensor 810. The one or more conductive layers described above may be opaque conductive layers.

The plurality of pixels PX1 and PX2 may further include an optical sensor arrangement region, which overlaps the optical sensor 810 disposed therebelow, and an optical sensor non-arrangement region that does not overlap the optical sensor 810. The optical sensor arrangement region may be a region in which the opening pixel PX1 and the light blocking pixel PX2 are mixed, and the optical sensor non-arrangement region may be a region in which the opening pixel PX1 is not disposed while only the light blocking pixel PX2 is disposed. However, the inventive concepts are not limited thereto. In some exemplary embodiments, the optical sensor non-arrangement region may be a region in which the opening pixel PX1 and the light blocking pixel PX2 are mixed, similarly to the optical sensor arrangement region.

Figure 6:
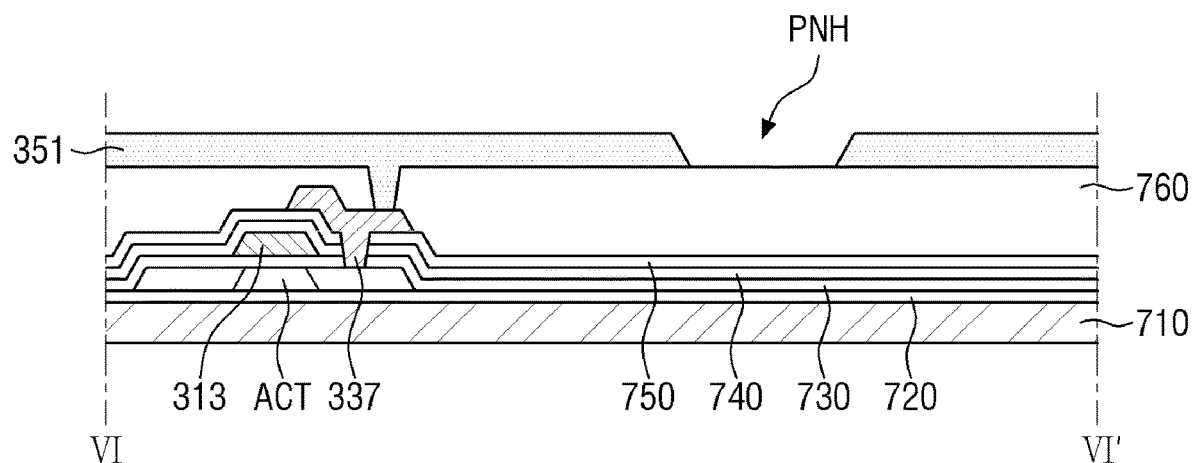
FIG. 6 is a cross-sectional view taken along line VI-VI' of FIG. 5.
Figure 7:
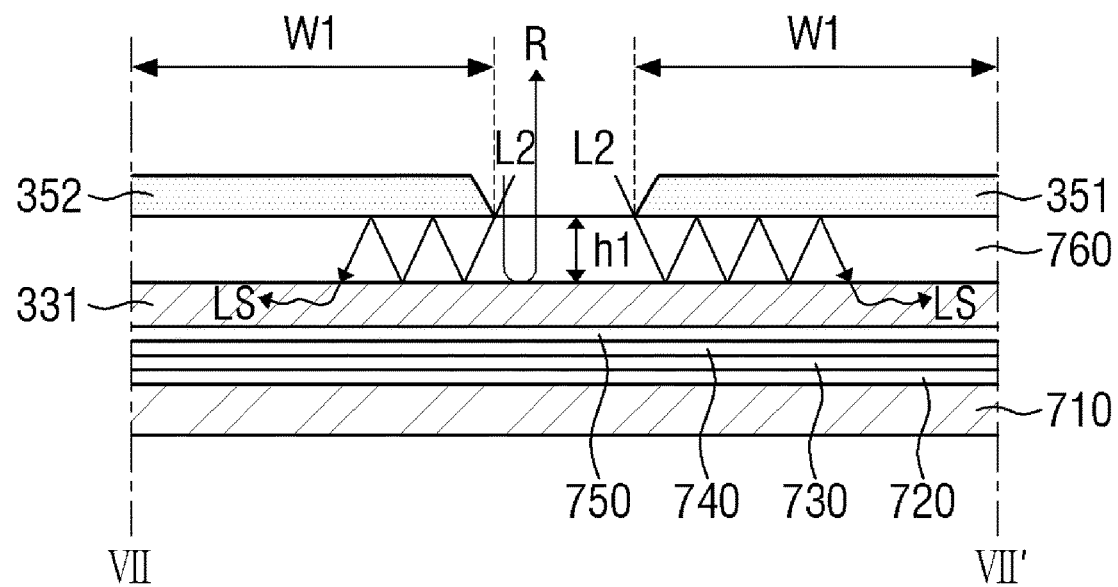
FIG. 7 is a cross-sectional view taken along line VII-VII' of FIG. 5.
Figure 8:
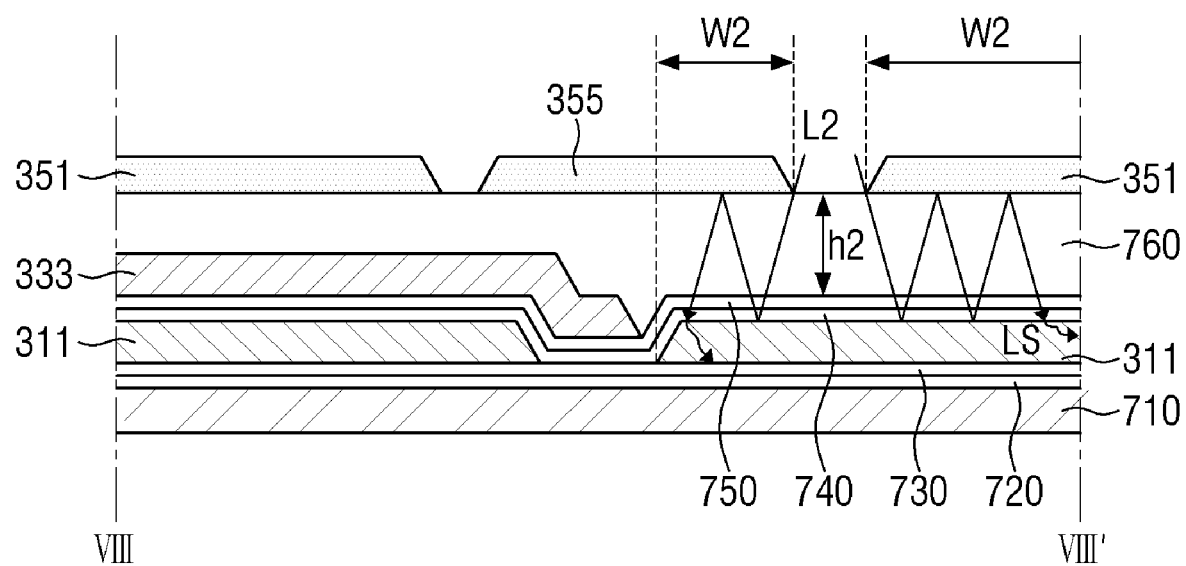
FIG. 8 is a cross-sectional view taken along line VIII-VIII' of FIG. 5.
Figure 9:
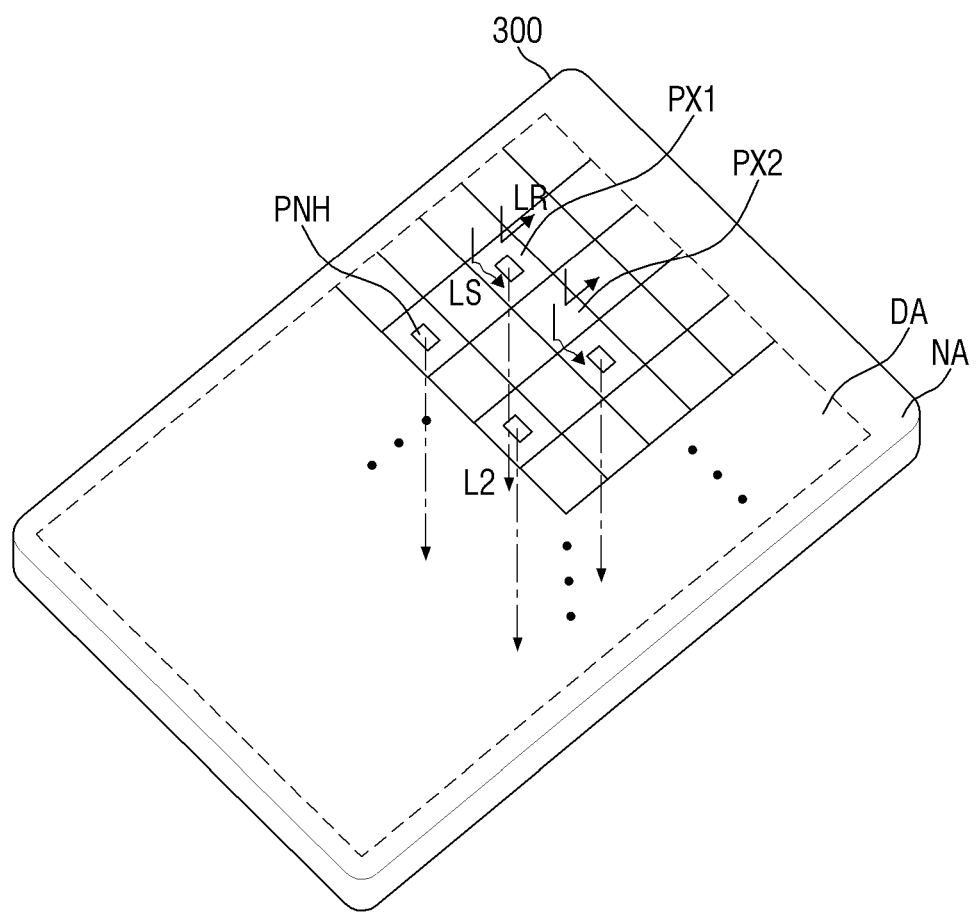
FIG. 9 is a perspective view illustrating a display device when sensor light is received.

FIG. 5 is a layout diagram of a plurality of pixels of a display device according to an exemplary embodiment. FIG. 6 is a cross-sectional view taken along line VI-VI' of FIG. 5. FIG. 7 is a cross-sectional view taken along line VII-VII' of FIG. 5. FIG. 8 is a cross-sectional view taken along line VIII-VIII' of FIG. 5. FIG. 9 is a perspective view illustrating a display device when the sensor light is received.

Referring to FIGS. 5 to 9, a plurality of pixels of the display device 1 includes a substrate 710, a plurality of conductive layers disposed on the substrate 710, and a plurality of insulating layers disposed between the plurality of conductive layers.

Each of the pixels PX1 and PX2 may include a substrate 710, a buffer layer 720, a first insulating layer 730, a first conductive layer 310, a second insulating layer 740, a second conductive layer 320, a third insulating layer 750, a second conductive layer 330, a via layer 760, and a third conductive layer 350, which are sequentially disposed. Each of the layers described above may be formed as a single layer, or a stack of multiple layers. In some exemplary embodiments, other layers may be further disposed between the layers.

The substrate 710 supports the respective layers disposed thereon. A transparent substrate may be used as the substrate 710 when the organic light emitting display device is a back emission type or a both-sided emission type. When the organic light emitting display device is a front emission type, in addition to a transparent substrate, a translucent or opaque substrate may be applied.

The substrate 710 may be formed of an insulating material, such as glass, quartz, or a polymer resin. Examples of the polymeric material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The substrate 710 may include a metal material.

The substrate 710 may be a rigid substrate or a flexible substrate, which can be bent, folded, or rolled. An example of the material of the flexible substrate may be polyimide (PI), but is not limited thereto.

The buffer layer 720 may be disposed on the entire surface of the substrate 710. The buffer layer 720 can prevent diffusion of impurity ions, prevent penetration of moisture or external air, and perform a surface planarization function. The buffer layer 720 may include silicon nitride, silicon oxide, silicon oxynitride, or the like. In some exemplary embodiments, the buffer layer 720 may be omitted depending on the type of the substrate 710, process conditions, and the like.

The first insulating layer 730 may be disposed on the buffer layer 720, and may be disposed substantially over the entire surface of the substrate 710. The first insulating layer 730 may be a gate insulating layer having a gate insulating function. The first insulating layer 730 may include a silicon compound, a metal oxide, or the like. For example, the first insulating layer 730 may include silicon oxide, silicon nitride, silicon oxynitride, aluminum oxide, tantalum oxide, hafnium oxide, zirconium oxide, titanium oxide, or the like. These may be used alone or in combination with each other. The first insulating layer 730 may be formed as a single layer or a stack of multilayer including different materials.

The first conductive layer 310 is disposed on the first insulating layer 730. The first conductive layer 310 may include a first-first gate pattern 311, a first-second gate pattern 313, a first-third gate pattern 315, and a first-fourth gate pattern 317.

Each of the first-first gate pattern 311, the first-second gate pattern 313, and the first-third gate pattern 315 may extend along the row direction. Each of the first-first gate pattern 311, the first-second gate pattern 313, and the first-third gate pattern 315 may extend along the row direction to the adjacent pixels beyond the boundaries of the pixels PX1 and PX2.

The first-first gate pattern 311 may be located on the upper side of the pixels PX1 and PX2. Although FIG. 5 shows that the first-first gate pattern 311 is not disposed in the light blocking pixel PX2 adjacent to the upper side in the column direction, the inventive concepts are not limited thereto. For example, in some exemplary embodiments, the first-first gate pattern 311 may be disposed over the lower side of the light blocking pixel PX2 adjacent to the upper side in the column direction.

The first-second gate pattern 313 may be located on the lower side of the first-first gate pattern 311 in the column direction. The first-third gate pattern 315 may be located on the lower side of the first-second gate pattern 313 in the column direction. FIG. 5 illustrates that the first-third gate pattern 315 is disposed over the upper side of the light blocking pixel PX2 adjacent to the lower side in the column direction.

The first-fourth gate pattern 317 may be located at the center of the pixel. The first-fourth gate pattern 317 may be located between the first-first gate pattern 311 and the first-second gate pattern 313 in plan view.

The first conductive layer 310 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 310 may be formed as a single layer or a multilayer.

The second insulating layer 740 serves to insulate the first conductive layer 310 from the second conductive layer 320. The second insulating layer 740 may be disposed on the first conductive layer 310, and may be disposed substantially over the entire surface of the substrate 710. The second insulating layer 740 may be an interlayer insulating layer.

The second insulating layer 740 may be formed of an inorganic insulating material, such as silicon oxide, silicon nitride, silicon oxynitride, hafnium oxide, aluminum oxide, titanium oxide, tantalum oxide and zinc oxide, or an organic insulating material, such as acrylic resin, epoxy resin, phenolic resin, polyamide resin, polyimide resin, unsaturated polyester resin, polyphenylene resin, polyphenylenesulfide resin, and benzocyclobutene (BCB). The second insulating layer 740 may be formed as a single layer or a stack of multilayer including different materials.

The third insulating layer 750 covers the second insulating layer 740. The third insulating layer 750 may be disposed substantially over the entire surface of the substrate 710. The third insulating layer 750 may include substantially the same material as the first insulating layer 730, or may include one or more materials forming the first insulating layer 730 described above. The third insulating layer 750 may be formed as a single layer or a stack of multilayer including different materials.

The second conductive layer 330 may be disposed on the third insulating layer 750.

The second conductive layer 330 may include a second-first data pattern 331, a second-second data pattern 333, a second-third data pattern 335, and a second-fourth data pattern 337, and a second-fifth data pattern 339.

The second-first data pattern 331 and the second-second data pattern 333 may extend along the column direction. The second conductive layer 330 may be disposed to partially overlap the first conductive layer 310 disposed therebelow.

The second-first data pattern 331 and the second-second data pattern 333 may extend to neighboring pixels beyond the boundaries of the pixels PX1 and PX2 along the column direction. The second-first data pattern 331 may be disposed adjacent to the left side of the pixels PX1 and PX2. FIG. 5 illustrates that the second-first data pattern 331 is disposed over the right side of the light blocking pixel PX2 adjacent to the left side in the row direction.

The second-second data pattern 333 may be disposed adjacent to the right side of the second-first data pattern 331 in the row direction. The second-first data pattern 331 may be disposed to overlap the first-first gate pattern 311 to the first-third gate pattern 315 disposed therebelow. As similar to the second-first data pattern 331, the second-second data pattern 333 may be disposed to overlap the first-first gate pattern 311 to the first-third gate pattern 315 disposed therebelow.

The second-third data pattern 335 to the second-fifth data pattern 339 may be disposed adjacent to the right side of the second-second data pattern 333 in the row direction. The second-third data pattern 335 and the second-fifth data pattern 339 may have a shape extending substantially in the column direction, and the second-fourth data pattern 337 may have a bent shape extending substantially in the row direction and then extending in the column direction, but the inventive concepts are not limited thereto.

One end of the second-third data pattern 335 may be disposed to overlap the first-first gate pattern 311, and the other end of the second-third data pattern 335 may be disposed to overlap the first-fourth gate pattern 317. The second-fourth data pattern 337 may be disposed to overlap the first-second gate pattern 313, and the second-fifth data pattern 339 may be disposed to overlap the first-third gate pattern 315.

The second conductive layer 330 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second conductive layer 330 may be formed as a single layer or a multilayer. For example, the second conductive layer 330 may have a stacked structure of Ti/Al/Ti, Mo/Al/Mo, Mo/AlGe/Mo, or Ti/Cu.

The via layer 760 serves to insulate the second conductive layer 330 from the third conductive layer 350. The via layer 760 may be disposed on the second conductive layer 330 and may be disposed substantially over the entire surface of the substrate 710. The via layer 760 may be an interlayer insulating layer. The via layer 760 may include substantially the same material as the second insulating layer 740 or may include one or more materials forming the second insulating layer 740 as described above. The via layer 760 may be formed as a single layer or a stack of multilayer including different materials.

The third conductive layer 350 is disposed on the via layer 760. The third conductive layer 350 may include third-first anode patterns 351 and 352, and a third-second mesh pattern 355. The third-first anode patterns may include an opening anode pattern 351 disposed in the opening pixel PX1 and a light blocking anode pattern 352 disposed in the light blocking pixel PX2. The opening anode pattern 351 may include the pinhole region PNH therein. More particularly, the pinhole region PNH may be completely surrounded by the opening anode pattern 351 in plan view. The third-second mesh pattern 355 may be disposed between the third-first anode patterns 351 and 352 adjacent to each other in the column direction.

The third-first anode patterns 351 and 352 of the third conductive layer 350 may be formed of a material having a high work function to facilitate hole injection, such as indium-tin-oxide (ITO), indium-zinc-oxide (IZO), zinc oxide (ZnO), indium oxide ($In_2O_3$), and the like. When the display device 1 is a front emission type display device, the third-first anode patterns 351 and 352 may further include a reflective metal layer. The reflective metal layer may be formed of, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a mixture thereof. In some exemplary embodiments, the third-first anode patterns 351 and 352 may have a two-layer structure, such as ITO/Ag and ITO/MgF, or a multi-layer structure such as ITO/Ag/ITO.

The third-second mesh pattern 355 of the third conductive layer 350 may include at least one of the above-mentioned materials of the third-first anode patterns 351 and 352, but the inventive concepts are not limited thereto.

The planar shape of the third-first anode patterns 351 and 352 may be a substantially hexagonal shape as shown in FIG. 5, but in some exemplary embodiments, the third-first anode patterns 351 and 352 may have other polygonal shapes.

The third-first anode patterns 351 and 352 may be disposed in the respective pixels PX1 and PX2. The opening anode pattern 351 is separated from the adjacent light blocking anode pattern 352. The pinhole region PNH may be surrounded by the opening anode pattern 351 in plan view. For example, the pinhole region PNH may be completely surrounded by the constituent material of the opening anode pattern 351. The third-first anode patterns 351 and 352 may substantially cover the respective pixels PX1 and PX2. The occupation ratio of the third-first anode patterns 351 and 352 in the respective pixels PX1 and PX2 may be about 0.7 to about 0.95. The occupation ratio of the third-first anode patterns 351 and 352 may be determined in consideration of the light blocking function of the respective pixels PX1 and PX2 and the prevention of a short circuit with the adjacent third-first anode pattern. The third-first anode patterns 351 and 352 may substantially cover the light transmission of the respective pixels PX1 and PX2 when the occupation ratio of the third-first anode patterns 351 and 352 in the respective pixels PX1 and PX2 is about 0.8 or more. Further, when the occupation ratio of the third-first anode patterns 351 and 352 in the respective pixels PX1 and PX2 is about 0.95 or less, it is possible to prevent physical contact with the adjacent third-first anode pattern, thereby preventing a short circuit. As such, the occupation ratio of the third-first anode patterns 351 and 352 in the respective pixels PX1 and PX2 may be about 0.8 to about 0.95.

Since the opening anode pattern 351 includes the pinhole region PNH therein as described above, the occupation ratio of the opening anode pattern 351 in the opening pixel PX1 may be smaller than the occupation ratio of the light blocking anode pattern 352 in the light blocking pixel PX2.

The planar shape of the third-second mesh pattern 355 may be a linear shape extending along the column direction. However, the inventive concepts are not limited thereto. For example, in some exemplary embodiments, the planar shape of the third-second mesh pattern 355 may further include a partially bent shape along the plane shape of the third-first anode patterns 351 and 352 arranged on the upper and lower sides in plan view.

The third conductive layer 350 may be disposed to overlap the first conductive layer 310 and the second conductive layer 330 disposed therebelow. The third-first anode patterns 351 and 352 may be disposed to overlap the first-first gate pattern 311 to the first-fourth gate pattern 317 of the first conductive layer 310, and may be disposed to overlap the second-first data pattern 331 to the second-fifth data pattern 339 of the second conductive layer 330. Further, the third-second mesh pattern 355 disposed on the upper side of each of the pixels PX1 and PX2 may be disposed to overlap the first-first gate pattern 311 and the first-third gate pattern 315 of another pixel adjacent to the upper side, and the third-second mesh pattern 355 disposed on the lower side of each of the pixels PX1 and PX2 may be disposed to overlap the first-third gate pattern 315 and the first-first gate pattern 311 of another pixel adjacent to the lower side.

As described above, the first to third conductive layers 310, 330, and 350 of each of the pixels PX1 and PX2 include regions overlapping each other in the thickness direction and regions where only one conductive layer is disposed without overlapping each other. Further, the opening pixel PX1 further includes a region (e.g., the pinhole region PNH) where the first to third conductive layers 310, 330, and 350 are not disposed. Hereinafter, a region in which the third conductive layer 350 is disposed in the opening pixel PX1 and which does not overlap other conductive layers is referred to as a "first region", a region in which the second conductive layer 330 is disposed and which does not overlap other conductive layers is referred to as a "second region", a region in which the first conductive layer 310 is disposed and which does not overlap other conductive layers is referred to as a "third region", a region in which the third conductive layer 350 and the second conductive layer 330 are disposed to overlap each other and which does not overlap the first conductive layer 310 is referred to as a "fourth region", a region in which the third conductive layer 350 and the first conductive layer 310 are disposed to overlap each other and which does not overlap the second conductive layer 330 is referred to as a "fifth region", a region in which the second conductive layer 330 and the first conductive layer 310 are disposed to overlap each other and which does not overlap the third conductive layer 350 is referred to as a "sixth region", a region in which the third conductive layer 350 to the first conductive layer 310 overlap each other is referred to as a "seventh region", and a region in which the third conductive layer 350 to the first conductive layer 310 are not disposed is referred to as an "eighth region".

As such, the opening pixel PX1 includes the first to eighth regions.

The light blocking pixel PX2 includes the first to seventh regions defined above, and does not include the eighth region where the third conductive layer 350 to the first conductive layer 310 are not disposed.

The opening pixel PX1 may be covered by the first to seventh regions except for the eighth region which includes the pinhole region PNH, and the light blocking pixel PX2 may be covered by the first to seventh regions. In this manner, the reflected light L2 reflected from the fingerprint of the user proceeds to the optical sensor 810 only through the pinhole region PNH, and the reflected light L2 is prevented from traveling to the optical sensor 810 in the remaining area, thereby preventing or suppressing the occurrence of noise when the optical sensor 810 recognizes the fingerprint shape of the user.

The arrangement of the first to third conductive layers 310, 330, and 350 around the opening pixel PX1 will be described in more detail. The plurality of pixels may include regions between the opening anode pattern 351 and the adjacent light blocking anode pattern 352, which are disposed on the right and left sides of the opening anode pattern 351 along the row direction, and regions between the opening anode pattern 351 and the adjacent third-second mesh pattern 355, which are disposed on the upper and lower sides of the opening anode pattern 351 along the column direction.

The regions between the opening anode pattern 351 and the adjacent light blocking anode pattern 352, which are disposed on the right and left sides of the opening anode pattern 351 along the row direction, may be covered by the second-first data pattern 331, and the first-first gate pattern 311 to the first-third gate pattern 315 as shown in FIG. 5.

More specifically, the regions between the opening anode pattern 351 and the adjacent light blocking anode pattern 352, which are disposed on the right and left sides, may be covered by the second-first data pattern 331 extending substantially in the column direction. Further, the upper side of the regions between the opening anode pattern 351 and the adjacent light blocking anode pattern 352, which are disposed on the right and left sides, may be covered by the first-first gate pattern 311. The central side of the regions between the opening anode pattern 351 and the adjacent light blocking anode pattern 352, which are disposed on the right and left sides, may be covered by the first-second gate pattern 313. The lower side of the regions between the opening anode pattern 351 and the adjacent light blocking anode pattern 352, which are disposed on the right and left sides, may be covered by the first-third gate pattern 315. That is, the regions between the opening anode pattern 351 and the adjacent light blocking anode pattern 352, which are disposed on the right and left sides, may be covered by the second region, in which only the second-first data pattern 331 of the second conductive layer 330 is disposed, and the sixth region, in which the second-first data pattern 331 and the first-first gate pattern 311 to the first-third gate pattern 315 of the first conductive layer 310 are disposed to overlap each other.

Meanwhile, as shown in FIG. 7, the reflected light L2 incident on the region between the third-first anode patterns 351 and 352 may travel to the second-first data pattern 331 after passing through the via layer 760. The reflected light L2 traveling to the second-first data pattern 331 may travel laterally while being totally reflected between the third-first anode patterns 351 and 352 and the second-first data pattern 331.

For example, about 96% of light reflected four times between the third conductive layer 350 and the second conductive layer 330 may be absorbed, and the remaining light of about 4% may travel laterally. The light travelling laterally may proceed to the optical sensor 810 below the display panel 300 shown in FIG. 4, which may cause noise to the user fingerprint shape information. In order to prevent this phenomenon, the width of the second-first data pattern 331 disposed to overlap the region between the third-first anode patterns 351 and 352 may be sufficiently enlarged, so as to increase the width of the overlapping region of the second-first data pattern 331 and the third-first anode patterns 351 and 352 on the upper side.

More specifically, a width W1 of the overlapping region of the second-first data pattern 331 and the third-first anode patterns 351 and 352 shown in FIG. 5 corresponds to a width, at which the reflected light L2 incident on the region between the third-first anode patterns 351 and 352 is absorbed (LS) while being totally reflected between the second-first data pattern 331 and the third-first anode patterns 351 and 352 and does not proceed to the optical sensor 810, or a width that may generate negligible noise even if a part of the reflected light L2 proceeds to the optical sensor 810. For example, the width W1 of the overlapping region (fourth region) of the second-first data pattern 331 and the third-first anode patterns 351 and 352 in the row direction has a correlation with a thickness h1 of the via layer 760 disposed between the third-first anode patterns 351 and 352 and the second-first data pattern 331 so as to satisfy the following equation:

$$W1 = R1 \times h1 \qquad [\text{Eq. 1}],$$

where W1 is a width of the overlapping region (fourth region) of the second-first data pattern 331 and the third-first anode patterns 351 and 352 in the row direction in the region between the third-first anode patterns 351 and 352, h1 is a thickness of the via layer 760, and R1 is a data pattern width constant.

Further, the data pattern width constant R1 may be determined in consideration of the constituent materials of the third-first anode patterns 351 and 352 and the second-first data pattern 331. In one exemplary embodiment, when the third-first anode patterns 351 and 352 and the second-first data pattern 331 include the materials described above, the data pattern width constant R1 may be about 3 to about 6. For example, the data pattern width constant R1 may be about 5. Also, in one exemplary embodiment, the thickness h1 of the via layer 760 may about 1.4 μm to about 1.8 μm.

More particularly, since the width W1 of the overlapping region (fourth region) of the second-first data pattern 331 and the third-first anode patterns 351 and 352 in the row direction in the region between the third-first anode patterns 351 and 352 satisfies Eq. 1 as represented above, the reflected light L2 incident on the region between the third-first anode patterns 351 and 352 is absorbed (LS) while being totally reflected between the second-first data pattern 331 and the third-first anode patterns 351 and 352, or negligible noise may be generated even if a part of the reflected light L2 proceeds to the optical sensor 810.

Further, the regions between the opening anode pattern 351 and the adjacent third-second mesh pattern 355, which are disposed on the upper and lower sides of the opening anode pattern 351, may be covered by the second-first data pattern 331, the second-second data pattern 333, and the first-first gate pattern 311 to the first-third gate pattern 315 as shown in FIG. 5.

More specifically, the regions between the opening anode pattern 351 and the adjacent third-second mesh pattern 355, which are located on the upper side, may be covered by the first-first gate pattern 311 extending substantially in the row direction, and the regions between the opening anode pattern 351 and the adjacent third-second mesh pattern 355, which are located on the lower side, may be covered by the first-third gate pattern 315 extending substantially in the row direction.

Further, the left side of the regions between the opening anode pattern 351 and the adjacent third-second mesh pattern 355, which are disposed on the upper and lower sides, may be covered by the second-first data pattern 331, the central side of the regions between the opening anode pattern 351 and the adjacent third-second mesh pattern 355, which are disposed on the upper and lower sides, may be covered by the second-second data pattern 333, and the right side of the regions between the opening anode pattern 351 and the adjacent third-second mesh pattern 355, which are disposed on the upper and lower sides, may be covered by the second-first data pattern 331 passing through the adjacent pixel PX2. That is, the regions between the opening anode pattern 351 and the adjacent third-second mesh pattern 355, which are disposed on the upper and lower sides, may be covered by the third region in which only the first-first gate pattern 311 and the first-third gate pattern 315 of the first conductive layer 310 are disposed, the second region in which only the second-first data pattern 331 and the second-second data pattern 333 are disposed, and the sixth region in which the first conductive layer 310 and the second conductive layer 330 are disposed to overlap each other.

Meanwhile, as shown in FIG. 7, the reflected light L2 incident on the region between the third-first anode patterns 351 and 352 and the third-second mesh pattern 355 may travel to the first conductive layer 310, which includes the first-first gate pattern 311 and the first-third gate pattern 315, after passing through the via layer 760 and the second and third insulating layers 740 and 750. The reflected light L2 traveling to the first conductive layer 310 may travel laterally while being totally reflected between the third-first anode patterns 351 and 352, the third-second mesh pattern 355, and the first conductive layer 310. The light travelling laterally may proceed to the optical sensor 810 as described above, and may cause noise to the user fingerprint shape information. In order to prevent this phenomenon, the width of the first-first gate pattern 311 and the first-third gate pattern 315 disposed to overlap the region between the third-first anode patterns 351 and 352 and the third-second mesh pattern 355 may be sufficiently enlarged so as to increase the width of the overlapping region of the third conductive layer 350 and the first conductive layer 310 on the upper side, e.g., the width of the fifth region in the column direction.

More specifically, a width W2 of the overlapping region of the first conductive layer 310 and the third conductive layer 350 shown in FIG. 5, e.g., the fifth region, in the column direction refers to a width at which the reflected light L2 incident on the region between the third-first anode patterns 351 and 352 and the third-second mesh pattern 355 is absorbed (LS) while being totally reflected between the first conductive layer 310 and the third conductive layer 350 and does not proceed to the optical sensor 810, or a width that may generate negligible noise even if a part of the reflected light L2 proceeds to the optical sensor 810. For example, the width W2 of the overlapping region of the third conductive layer 350 and the first conductive layer 310 in the column direction has a correlation with a distance between the third conductive layer 350 and the first conductive layer 310, e.g., the sum h2 of the thicknesses of the second and third insulating layers 740 and 750 and the insulating layer, such as the via layer 760, disposed between the third conductive layer 350 and the first conductive layer 310 so as to satisfy the following equation:

$$W2 = R2 \times h2 \quad \text{[Eq. 2]},$$

where W2 is a width of the overlapping region (fifth region) of the first conductive layer 310 and the third conductive layer 350 in the column direction in the region between the third-first anode patterns 351 and 352 and the third-second mesh pattern 355, h2 is a thickness between the first conductive layer 310 and the third conductive layer 350, and R2 is a gate pattern width constant.

Further, similarly to the data pattern width constant R1, the gate pattern width constant R2 may be determined in consideration of the constituent materials of the third conductive layer 350 and the first conductive layer 310. In one exemplary embodiment, when the third conductive layer 350 and the first conductive layer 310 include the materials described above, the gate pattern width constant R2 may be about 3 to about 6. For example, the gate pattern width constant R2 may be about 5. Also, in one exemplary embodiment, the thickness h2 between the first conductive layer 310 and the third conductive layer 350 may be about 4 μm to about 6.5 μm.

That is, since the width W2 of the overlapping region of the first conductive layer 310 and the third conductive layer 350 in the region between the third-first anode patterns 351 and 352 and the third-second mesh pattern 355 satisfies Eq. 2 as represented above, the reflected light L2 incident on the region between the third-first anode patterns 351 and 352 and the third-second mesh pattern 355 is absorbed (LS) while being totally reflected between the third conductive layer 350 and the first conductive layer 310, or negligible noise may be generated even if a part of the reflected light L2 proceeds to the optical sensor 810.

Referring to FIG. 9, as described above, the reflected light L2 reflected from the fingerprint of the user can be transmitted as it is through the pinhole region PNH, e.g., the eighth region, of the opening pixel PX1 among the plurality of pixels PX1 and PX2. However, in the first to seventh regions except for the eighth region, the reflected light L2 may be reflected (LR) by the stacked conductive patterns of the pixels PX1 and PX2, or may be absorbed (LS), in a space between the conductive patterns of the third conductive layer 350, through a thickness space between the stacked conductive patterns, for example, a space between the third conductive layer 350 and the second conductive layer 330, and between the third conductive layer 350 and the first conductive layer 310. Accordingly, the reflected light L2 reflected from the user's fingerprint may be prevented from proceeding to the optical sensor 810, thereby preventing the occurrence of noise when the optical sensor 810 recognizes the fingerprint shape of the user.

Figure 10:
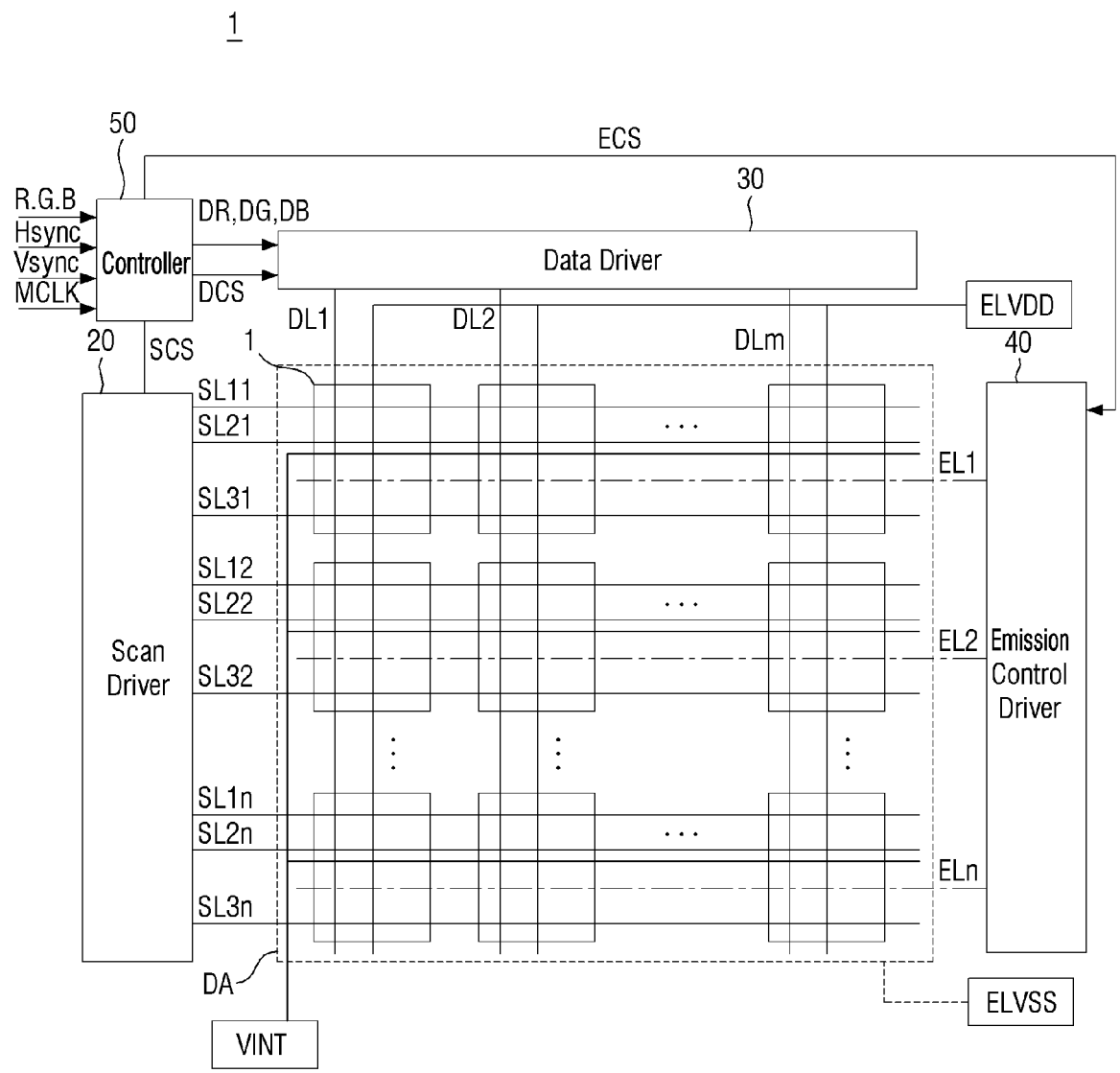
FIG. 10 is a schematic block diagram of a display device according to an exemplary embodiment.
Figure 11:
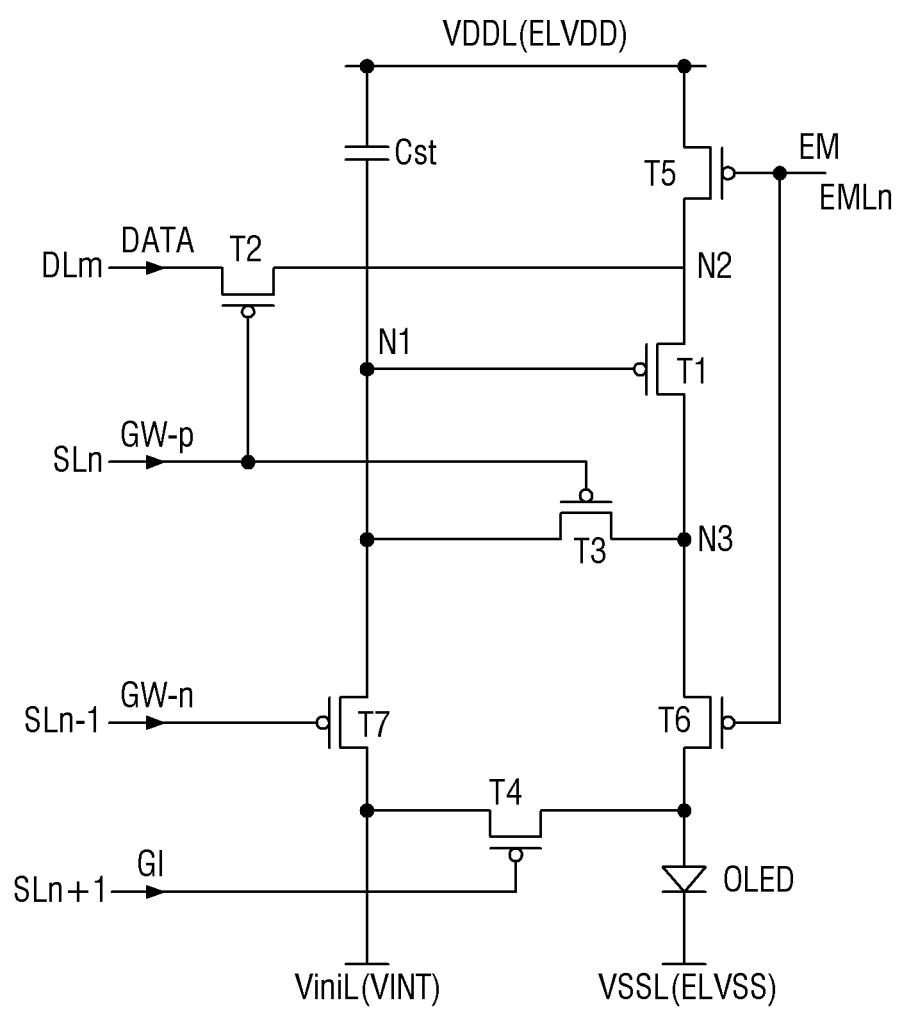
FIG. 11 is an exemplary equivalent circuit diagram of one pixel of a display device according to an exemplary embodiment.

FIG. 10 is a schematic block diagram of a display device according to an exemplary embodiment. FIG. 11 is an exemplary equivalent circuit diagram of one pixel of a display device according to an exemplary embodiment.

Referring to FIG. 10, the display device 1 includes a display area DA including a plurality of pixels, a scan driver 20, a data driver 30 (also shown as 610 in FIG. 2), an emission control driver 40, and a controller 50. The controller 50 functions to control the scan driver 20, the data driver 30, and the emission control driver 40. The controller 50 may include the main driver 840 of FIG. 2.

The display area DA includes a plurality of scan lines SL11 to SL1n, SL21 to SL2n and SL31 to SL3n (n is an integer of 2 or more), a plurality of data lines DL1 to DLm (m is an integer of 2 or more), and a plurality of pixels arranged in a matrix form at the intersections of the plurality of emission control lines EL1 to ELn.

The plurality of scan lines SL11 to SL1n, SL21 to SL2n and SL31 to SL3n, and the plurality of emission control lines EL1 to ELn may extend in the row direction, and the plurality of data lines DL1 to DLm may extend in the column direction. In some exemplary embodiments, the row direction and the column direction may be switched to each other. An initialization voltage (VINT) supply line may be branched for each row to extend in the row direction, and a first source voltage (ELVDD) supply line may be branched for each column to extend in the column direction. However, the inventive concepts are not limited thereto, and the extending directions of the initialization voltage (VINT) supply line and the first source voltage (ELVDD) supply line may be variously modified.

Three scanning lines SL11, SL21 and SL31, one data line DL1, one emission control line EML, one initialization voltage (VINT) supply line, and one first source voltage (ELVDD) supply line may pass through the pixels of the first row and the first column, which are exemplary pixels. In some exemplary embodiments, the same lines may pass through the other pixels.

The scan driver 20 generates and transmits three scan signals to each pixel through the plurality of scan lines SL11 to SL1n, SL21 to SL2n, and SL31 to SL3n. More particularly, the scan driver 20 sequentially supplies the scan signals to the first scan lines SL11 to SL1n, the second scan lines SL21 to SL2n, or the third scan lines SL31 to SL3n.

The data driver 30 transmits a data signal to each pixel 10 through the plurality of data lines DL1 to DLm. The data signal is supplied to the pixel 10 selected by the second scan signal when the second scan signal is supplied to the first scan lines SL11 to SL1n.

The emission control driver 40 generates and transmits an emission control signal to each pixel 10 through a plurality of emission control lines EML1 to EMLn. The emission control signal controls the emission time of the pixel 10. In some exemplary embodiments, the emission control driver 40 may be omitted depending on the internal structure of the pixel 10 or when the scan driver 20 generates the emission control signal as well as the scan signal.

The controller 50 converts a plurality of image signals R, G, and B transmitted from the outside into a plurality of image data signals DR, DG, and DB and transmits them to the data driver 30. Further, the controller 50 receives a vertical synchronization signal Vsync, a horizontal synchronization signal Hsync, and a clock signal MCLK, and generates and transmits control signals for controlling the driving of the scan driver 20, the data driver 30, and the emission control driver 40. More particularly, the controller 50 generates and transmits a scan driving control signal SCS for controlling the scan driver 20, a data driving control signal DCS for controlling the data driver 30, and an emission driving control signal ECS for controlling the emission control driver 40, respectively.

Each of the plurality of pixels is supplied with a first source voltage ELVDD and a second source voltage ELVSS.

The first source voltage ELVDD may be a predetermined high level voltage, and the second source voltage ELVSS may be a voltage lower than the first source voltage ELVDD.

Each of the plurality of pixels 10 emits light of a predetermined luminance by a driving current supplied to a light emitting element according to a data signal transmitted through a plurality of data lines DL1 to DLm.

The first source voltage ELVDD, the second source voltage ELVSS, the initialization voltage VINT, and the like may be supplied from an external voltage source.

Referring to FIG. 11, an exemplary circuit of one pixel of the display device 1 includes an organic light emitting diode OLED, a plurality of transistors T1 to T7, and a storage capacitor Cst. A data signal DATA, a first scan signal Gw-p, a second scan signal Gw-n, a third scan signal GI, an emission control signal EM, the first source voltage ELVDD, the second source voltage ELVSS, and the initialization voltage VINT are applied to a circuit of one pixel.

The organic light emitting diode OLED includes an anode electrode and a cathode electrode. The storage capacitor Cst includes a first electrode and a second electrode.

The plurality of transistors may include first to seventh transistors T1 to T7. Each of the transistors T1 to T7 includes a gate electrode, a first electrode, and a second electrode. One of the first and second electrodes of each of the transistors T1 to T7 is a source electrode and the other electrode is a drain electrode. Each of the transistors T1 to T7 may be a thin film transistor.

Hereinafter, each configuration will be described in detail.

The gate electrode of the first transistor T1 is connected to the first electrode of the storage capacitor Cst. The first electrode of the first transistor T1 is connected to a first source voltage supply line VDDL for applying the first source voltage ELVDD via the fifth transistor T5. The second electrode of the first transistor T1 is connected to the anode electrode of the organic light emitting diode OLED via the sixth transistor T6. The first transistor T1 receives the data signal DATA according to the switching operation of the third transistor T2 and supplies a driving current to the organic light emitting diode OLED.

The gate electrode of the second transistor T2 is connected to the second scan line SLn for applying the second scan signal Gw-p. The first electrode of the second transistor T2 is connected to the data line DLm. The second electrode of the second transistor T2 is connected to the first electrode of the first transistor T1, and is connected to the first source voltage supply line VDDL via the fifth transistor T5. The second transistor T2 is turned on according to the first scan signal Gw-p, and performs a switching operation of transmitting the data signal DATA to the first electrode of the first transistor T1.

The gate electrode of the third transistor T3 is connected to the second scan line SLn for applying the second scan signal Gw-p. The first electrode of the third transistor T3 is connected to the first electrode of the sixth transistor T6 and the second electrode of the first transistor T1. The second electrode of the third transistor T3 is connected to the first electrode of the seventh transistor T7, the first electrode of the storage capacitor Cst, and the gate electrode of the first transistor T1.

The gate electrode of the fourth transistor T4 is connected to the third scan line SLn+1 for applying the third scan signal GI. The second electrode of the fourth transistor T4 is connected to the initialization voltage VINT supply line ViniL and the second electrode of the third transistor T3. The first electrode of the fourth transistor T4 is connected to the anode electrode of the organic light emitting diode OLED and the second electrode of the sixth transistor T6.

The gate electrode of the fifth transistor T5 is connected to the emission control line EMLn for applying the emission control signal EM. The first electrode of the fifth transistor T5 is connected to the first source voltage ELVDD terminal. The second electrode of the fifth transistor T5 is connected to the first electrode of the first transistor T1 and the second electrode of the second transistor T2.

The gate electrode of the sixth transistor T6 is connected to the emission control line EMLn for applying the emission control signal EM. The first electrode of the sixth transistor T6 is connected to the second electrode of the first transistor T1. The second electrode of the sixth transistor T6 is connected to the anode electrode of the organic light emitting diode OLED.

The fifth transistor T5 and the sixth transistor T6 are simultaneously turned on in response to the emission control signal EM so that the driving current flows through the organic light emitting diode OLED.

The gate electrode of the seventh transistor T7 is connected to the first scan line SLn−1 for applying the first scan signal Gw-n. The first electrode of the seventh transistor T7 is connected to the first electrode of the storage capacitor Cst and the gate electrode of the first transistor T1, and the second electrode of the seventh transistor T7 is connected to the initialization voltage line ViniL for applying the initialization voltage VINT.

The second electrode of the storage capacitor Cst is connected to the first source voltage supply line VDDL. The first electrode of the storage capacitor Cst is connected to both the gate electrode of the first transistor T1 and the second electrode of the third transistor T3. The cathode electrode of the organic light emitting diode OLED is connected to the second source voltage ELVSS supply line VSSL. The organic light emitting diode OLED receives the driving current from the first transistor T1 and emits light to display an image.

Referring to FIGS. 5, 10, and 11, in the illustrated 7 transistors and 1 capacitor (7T1C) structure according to an exemplary embodiment, the first-first gate pattern 311 of the opening pixel PX1 may be the second scan line SLn for applying the second scan signal Gw-p, and the first-second gate pattern 313 may be the emission control line EMLn for applying the emission control signal EM. The first-third gate pattern 315 may be the third scan line SLn+1 for applying the third scan signal GI. The first-third gate pattern 315 disposed on the upper side of the opening pixel PX1 in the column direction and the light blocking pixel PX2 disposed adjacent to the upper side of the opening pixel PX1 in the column direction may be the first scan line SLn−1 for applying the first scan signal Gw-n. Further, the first-fourth gate patterns 317 may be the gate electrode of the first transistor T1 or the first electrode of the storage capacitor Cst.

Further, the second-first data pattern 331 may be the data line DLm for applying the data signal DATA, and the second-second data pattern 333 may be the first source voltage supply line VDDL for applying the first source voltage ELVDD.

The second-third data pattern 335 is electrically connected to the first-fourth gate pattern 317, and may be a connection electrode for connecting the first-fourth gate pattern 317 to the second electrode region of the third transistor T3 described above.

The second-fourth data pattern 337 may be a connection electrode for connecting the second electrode region of the sixth transistor T6 to the third-first anode pattern 351 of the third conductive layer 350.

In some exemplary embodiments, a fourth conductive layer may be further disposed between the second insulating layer 740 and the third insulating layer 750 of FIG. 6. The fourth conductive layer may include a storage capacitor electrode line, a voltage mesh electrode, and an initialization voltage line for supplying the initialization voltage VINT (see FIG. 11). The second-third data pattern 335 may be a connection electrode connected to the initialization voltage line.

The second-fifth data pattern 339 may be a connection electrode for electrically connecting the second electrode region of the seventh transistor T7 to the initialization voltage line.

Hereinafter, a display device according to another exemplary embodiment will be described, and substantially the same components as those of the above-described exemplary embodiment are denoted by the same reference numerals, and thus, descriptions thereof will be omitted or simplified to avoid redundancy.

Figure 12:
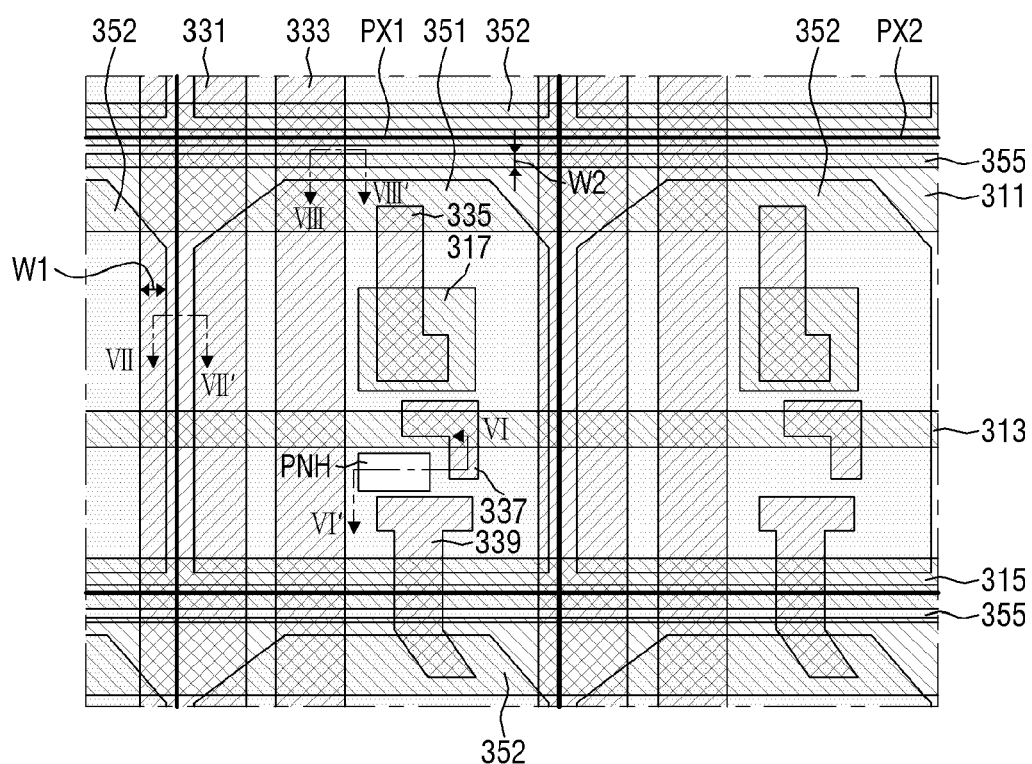
FIG. 12 is a layout diagram of a plurality of pixels of a display device according to another exemplary embodiment.
Figure 13:
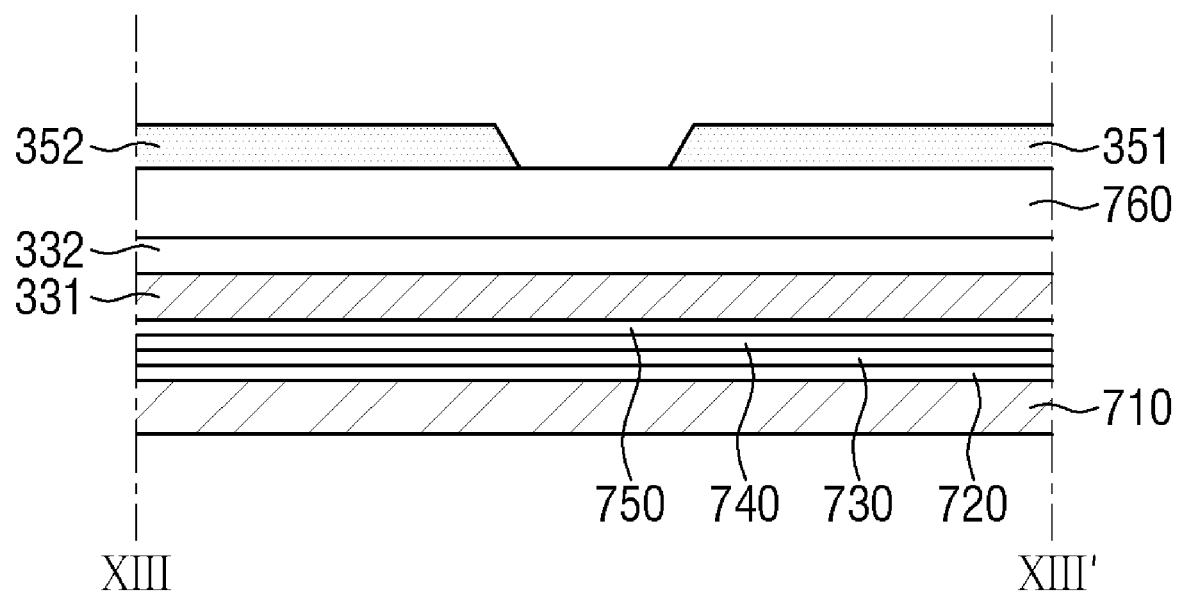
FIG. 13 is a cross-sectional view taken along line XIII-XIII' of FIG. 12.

FIG. 12 is a layout diagram of a plurality of pixels of a display device according to another exemplary embodiment. FIG. 13 is a cross-sectional view taken along line XIII-XIII' of FIG. 12.

Referring to FIGS. 12 and 13, a display device 2 according to the illustrated exemplary embodiment is different from the display device 1 of FIGS. 5 to 8 in that a low reflective metal layer 332 is further disposed between the second conductive layer 330 and the via layer 760 of each of the pixels PX1 and PX2.

More specifically, the display device 2 according to the illustrated exemplary embodiment may further include the low reflective metal layer 332 between the second conductive layer 330 and the via layer 760. The low reflective metal layer 332 may function to reduce the number of times the reflected light L2 is totally reflected between the third conductive layer 350 and the second conductive layer 330. More particularly, the low reflective metal layer 332 can prevent the reflected light L2 incident between the third-first anode patterns 351 and 352 from traveling to the optical sensor 810 while being totally reflected in the lateral direction.

The low reflective metal layer 332 may be disposed to overlap the second-first data pattern 331 of the second conductive layer 330 in the thickness direction. That is, the planar profile of the low reflective metal layer 332 may be substantially the same as the planar profile of the second-first data pattern 331.

The side surface of the low reflective metal layer 332 may be aligned with the side surface of the second-first data pattern 331 of the second conductive layer 330 in the thickness direction. The low reflective metal layer 332 may be formed by using a mask having substantially the same shape as the second-first data pattern 331, but the inventive concepts are not limited thereto.

In some exemplary embodiments, the low reflective metal layer 332 may be disposed to overlap other data patterns of the second conductive layer 330 in the thickness direction. For example, the low reflective metal layer 332 may be further disposed between the via layer 760, the second-fifth data pattern 339, and the second-second data pattern 333, which partially overlap a region between the conductive patterns of the third conductive layer 350. The planar profile of the low reflective metal layer 332 may be substantially the same as the planar profile of the second-second data pattern 333 and the planar profile of the second-fifth data pattern 339.

More specifically, when the reflected light L2 is reflected four times between the low reflective metal layer 332 and the third conductive layer 350, about 0.2% or less of the reflected light L2 may travel laterally. According to the illustrated exemplary embodiment, by arranging the low reflective metal layer 332 between the third conductive layer 350 and the second conductive layer 330, it is possible to prevent the reflected light L2 from traveling laterally or at least reduce this phenomenon. As such, it is possible to prevent the laterally traveling light from proceeding to the optical sensor 810, which may otherwise cause the noise to the user fingerprint shape information.

Figure 14:
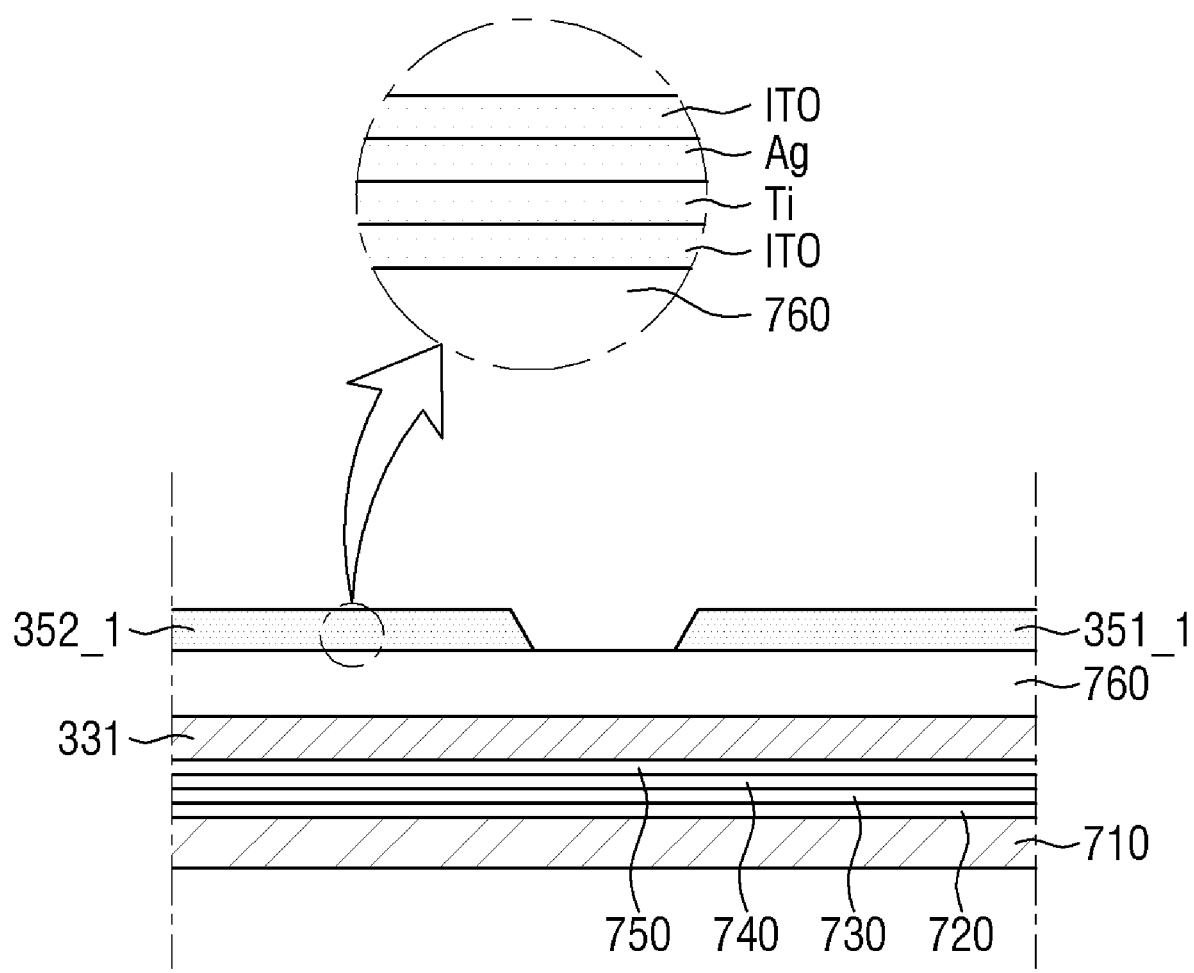
FIG. 14 is a cross-sectional view of a pixel according to still another exemplary embodiment.
Figure 15:
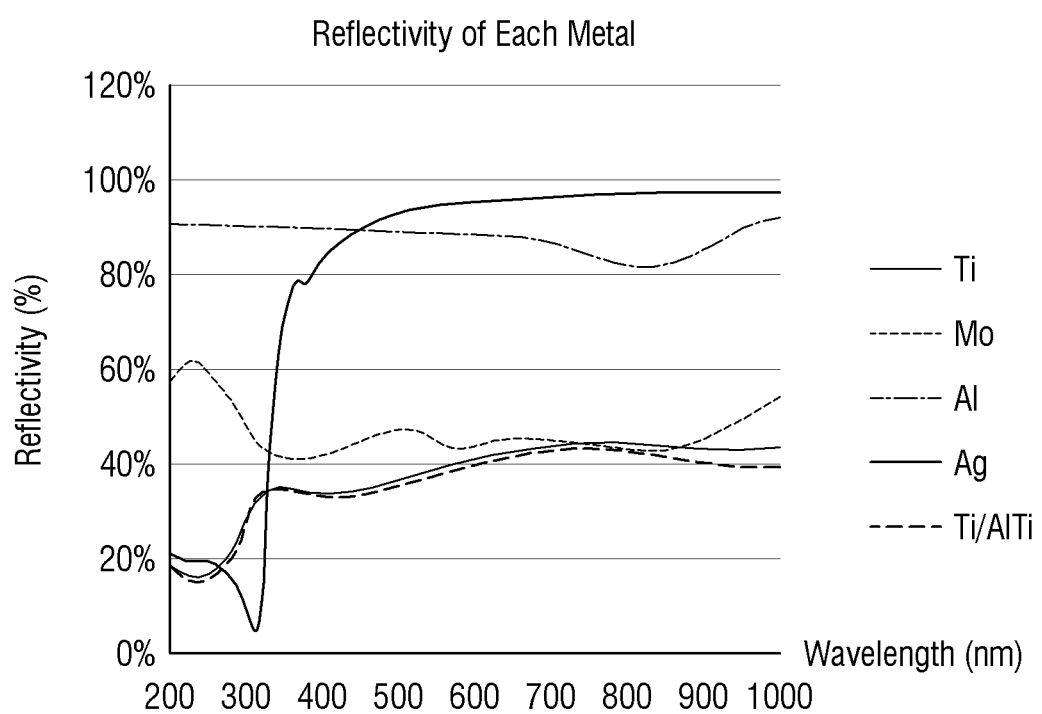
FIG. 15 is a graph showing reflectivity of each metal.

FIG. 14 is a cross-sectional view of a pixel according to still another exemplary embodiment, and FIG. 15 is a graph showing reflectivity of each metal.

Referring to FIGS. 14 and 15, the display device according to the illustrated exemplary embodiment is different from the display device of FIG. 5 in the constituent material of the third conductive layer 350 of each of the pixels PX1 and PX2.

More specifically, a third conductive layer 350_1 may further include a low reflective metal material. The low reflective metal material may reduce the number of times the reflected light L2 is totally reflected between the third conductive layer 350 and the second conductive layer 330. In the illustrated exemplary embodiment, the third conductive layer 350_1 may further include a metal material having reflectivity of about 50% or less in the wavelength range of visible light. For example, the third conductive layer 350_1 may further include titanium (Ti). More specifically, titanium (Ti) may be disposed under silver (Ag) in the stacked structure of the third conductive layer 350_1. For example, the third conductive layer 350_1 according to the illustrated exemplary embodiment may have a stacked structure of ITO/Ti/Ag/ITO.

Referring to FIG. 15, it can be seen that silver (Ag) has reflectivity of about 80% or more in the wavelength range of visible light, while titanium (Ti) has reflectivity of about 50% or less in the wavelength range of visible light.

In the illustrated exemplary embodiment, the third conductive layer 350_1 further includes the low reflective metal material, thereby preventing the reflected light L2 from traveling laterally or at least reducing this phenomenon. Thus, it is possible to prevent the laterally traveling light from proceeding to the optical sensor 810, which may otherwise cause the noise to the user fingerprint shape information.

Figure 16:
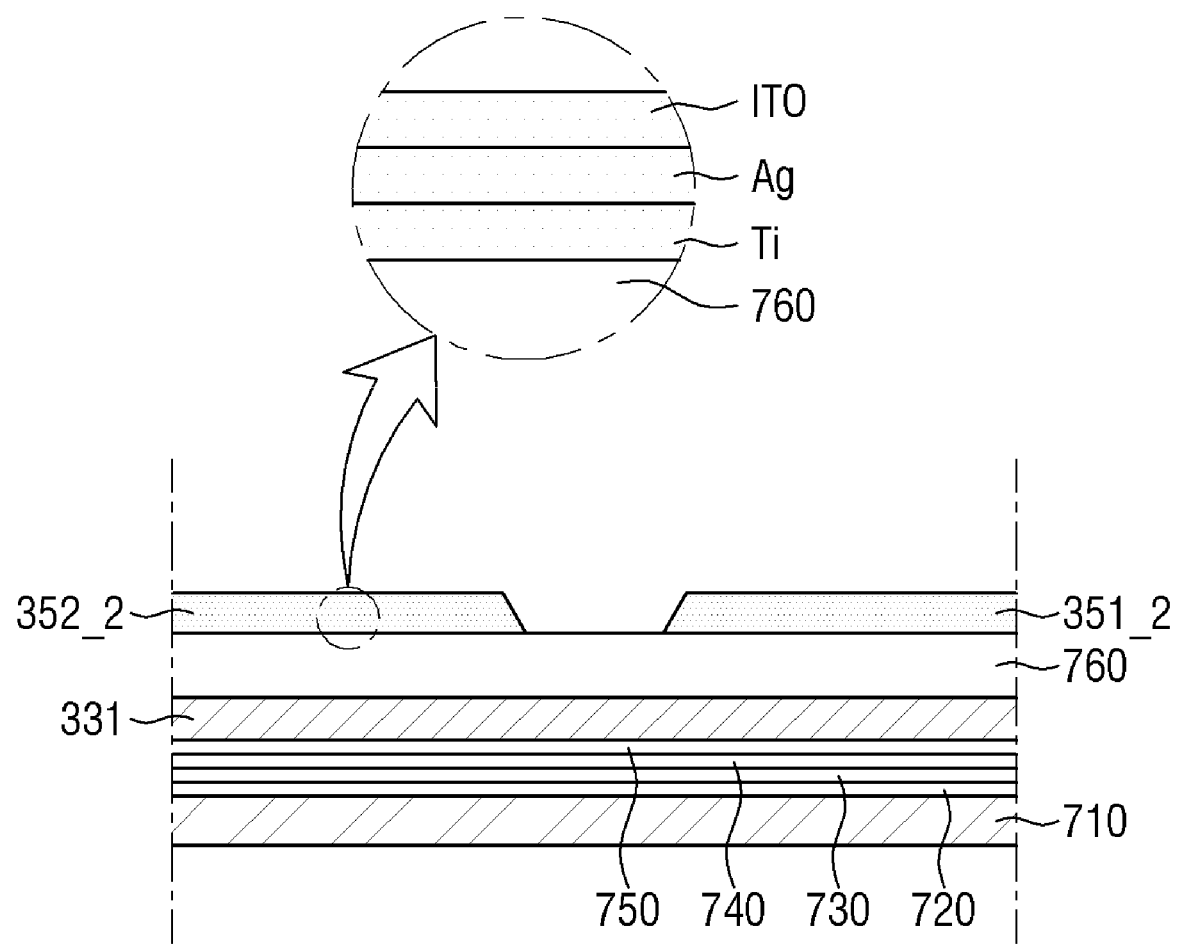
FIG. 16 is a cross-sectional view of a pixel according to still another exemplary embodiment.

FIG. 16 is a cross-sectional view of a pixel according to still another exemplary embodiment.

Referring to FIG. 16, a display device according to the illustrated exemplary embodiment further includes the low reflective metal material described above with reference to FIG. 14, but a stacked structure of a third conductive layer 350_2 is different from that shown in FIG. 14. More specifically, the third conductive layer 350_2 according to the illustrated exemplary embodiment may include a stacked structure of, for example, Ti/Ag/ITO.

In addition, the third conductive layer 350_2 further includes the low reflective metal material, thereby preventing the reflected light L2 from traveling laterally or at least reducing this phenomenon. Thus, it is possible to prevent the laterally traveling light from proceeding to the optical sensor 810, which may otherwise cause the noise to the user fingerprint shape information.

Figure 18:
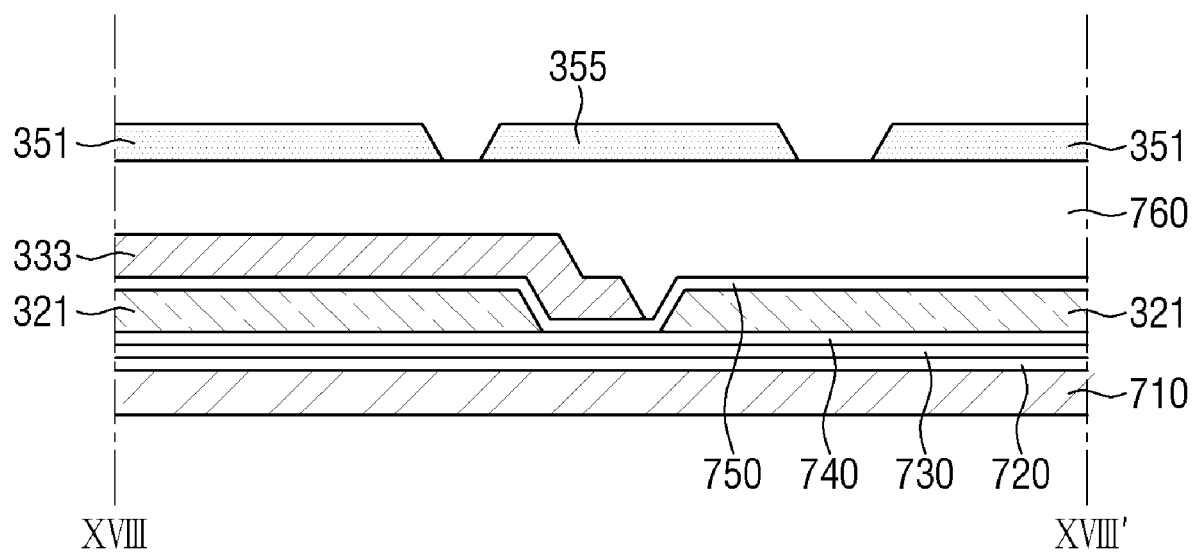
FIG. 18 is a cross-sectional view taken along line XVIII-XVIII' of FIG. 17.

FIG. 17 is a layout diagram of a plurality of pixels of a display device according to still another exemplary embodiment. FIG. 18 is a cross-sectional view taken along line XVIII-XVIII' of FIG. 17.

Referring to FIGS. 17 and 18, a display device 3 according to the illustrated exemplary embodiment is different from the display device of FIGS. 5 to 8 in that a fourth-first conductive pattern 321 of the fourth conductive layer disposed between the first conductive layer 310 and the second conductive layer 330 is disposed to overlap a region between the third-first anode patterns 351 and 352 and the third-second mesh pattern 355.

More particularly, the fourth-first conductive pattern 321 may be disposed to overlap a region between the third-first anode patterns 351 and 352 and the third-second mesh pattern 355 in place of the first-first gate pattern 311.

Each of the pixels PX1 and PX2 may further include a ninth region in which only the fourth conductive layer is disposed, a tenth region in which the fourth conductive layer and the third conductive layer 350 are disposed to overlap each other, an eleventh region in which the fourth conductive layer and the second conductive layer 330 are disposed to overlap each other, and a twelfth region in which the fourth conductive layer, the third conductive layer 350, and the second conductive layer 330 are disposed to overlap each other.

More specifically, as described above, a width of the overlapping region of the third conductive layer 350 and the fourth-first conductive pattern 321 of the fourth conductive layer, e.g., the tenth region, in the column direction refers to a width at which the reflected light L2 incident on the region between the third-first anode patterns 351 and 352 and the third-second mesh pattern 355 is absorbed (LS) while being totally reflected between the fourth conductive layer and the third conductive layer 350 and does not proceed to the optical sensor 810, or a width that may generate negligible noise even if a part of the reflected light L2 proceeds to the optical sensor 810. For example, the width of the overlapping region of the third conductive layer 350 and the fourth conductive layer, such as the width in the column direction, may be substantially the same as the width of the overlapping region of the third conductive layer 350 and the first conductive layer 310, or may be smaller than the width of the overlapping region of the third conductive layer 350 and the first conductive layer 310 without being limited thereto.

Accordingly, by ensuring a sufficient overlapping width of the third conductive layer 350 and the fourth conductive layer in the region between the third-first anode patterns 351 and 352 and the third-second mesh pattern 355, the reflected light L2 incident on the region between the third-first anode patterns 351 and 352 and the third-second mesh pattern 355 is absorbed (LS) while being totally reflected between the third conductive layer 350 and the fourth conductive layer, or may generate negligible noise even if a part of the reflected light L2 proceeds to the optical sensor 810.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device including a plurality of pixels arranged in a matrix, the display device comprising:
a substrate;
a first anode disposed on the substrate; and
opaque conductive layers disposed between the substrate and the first anode,
wherein the plurality of pixels include an opening pixel including a first anode arrangement region, a pinhole region located around the first anode arrangement region and surrounded by the first anode, and a first anode non-arrangement region including an exposed region located outside the first anode, and
wherein the opaque conductive layers completely cover the exposed region and at least partially expose the pinhole region.

2. The display device of claim 1, wherein the plurality of pixels further include a light blocking pixel adjacent to the opening pixel,
wherein the light blocking pixel includes a second anode arrangement region and a second anode non-arrangement region located around the second anode arrangement region, and
wherein the second anode non-arrangement region is completely covered by the opaque conductive layers.

3. The display device of claim 1, wherein the pinhole region is completely surrounded by the first anode.

4. The display device of claim 2, further comprising:
an optical sensor arrangement region which overlaps an optical sensor disposed below the substrate; and
an optical sensor non-arrangement region which does not overlap the optical sensor.

5. The display device of claim 4, wherein the optical sensor non-arrangement region includes only the light blocking pixel.

6. The display device of claim 4, wherein the optical sensor comprises an optical fingerprint sensor.

7. The display device of claim 2, further comprising an optical sensor arrangement region which overlaps an optical sensor disposed below the substrate,
wherein the optical sensor arrangement region includes at least a part of the opening pixel and the light blocking pixel.

8. The display device of claim 2, wherein:
the opaque conductive layers include a first conductive layer disposed on the substrate; and
a second conductive layer disposed between the first conductive layer and the first anode.

9. The display device of claim 8, wherein the second conductive layer is disposed to overlap a first gap between the first anode arrangement region and the second anode arrangement region.

10. The display device of claim 9, wherein the second conductive layer extends to the first anode arrangement region and the second anode arrangement region adjacent thereto.

11. The display device of claim 10, further comprising a via layer having a first thickness and disposed between the second conductive layer and the first anode,
wherein the second conductive layer extends from the first gap such that a portion of the second conductive layer overlapping the first anode in a direction from the first anode toward the second anode has a second with equal to or greater than three times the first thickness.

12. The display device of claim 9, wherein the first gap includes:
a first region in which the first gap and the second conductive layer overlap each other;
a second region in which the first gap and the first conductive layer overlap each other; and a third region in which the first gap, the first conductive layer, and the second conductive layer overlap each other.

13. The display device of claim 8, wherein the first conductive layer includes at least one of a scan signal line, an emission signal line, and an initialization signal line.

14. The display device of claim 8, wherein the second conductive layer includes at least one of a data line and a first source voltage line.

15. The display device of claim 3, wherein an occupation ratio of the first anode arrangement region and the second anode arrangement region in the opening pixel and the light blocking pixel is about 80% to about 95%, respectively.

16. A display device including a plurality of pixels arranged in a matrix, the display device comprising:
   a substrate;
   a first anode disposed on the substrate; and
   opaque conductive layers disposed between the substrate and the first anode,
   wherein the plurality of pixels include:
      an opening pixel including a first anode arrangement region, a pinhole region located around the first anode arrangement region and surrounded by the first anode, and a first anode non-arrangement region including an exposed region located outside the first anode; and
      a light blocking pixel adjacent to the opening pixel and including a second anode arrangement region and a second anode non-arrangement region located around the second anode arrangement region, and
   wherein the opaque conductive layers completely cover the exposed region of the first anode non-arrangement region and the second anode non-arrangement region, and at least partially expose the pinhole region.

17. The display device of claim 16, wherein the pinhole region is completely surrounded by the first anode.

18. The display device of claim 17, further comprising:
   an optical sensor arrangement region which overlaps an optical sensor disposed below the substrate; and
   an optical sensor non-arrangement region which does not overlap the optical sensor.

19. The display device of claim 18, wherein:
   the optical sensor arrangement region includes at least a part of the opening pixel and the light blocking pixel; and
   the optical sensor non-arrangement region includes only the light blocking pixel.

20. The display device of claim 18, wherein the optical sensor comprises an optical fingerprint sensor.

* * * * *